(12) United States Patent
Glass et al.

(10) Patent No.: US 10,978,568 B2
(45) Date of Patent: Apr. 13, 2021

(54) PASSIVATION OF TRANSISTOR CHANNEL REGION INTERFACES

(71) Applicant: INTEL CORPORATION, Santa Clara, CA (US)

(72) Inventors: Glenn A. Glass, Portland, OR (US); Mark R. Brazier, Lake Oswego, OR (US); Anand S. Murthy, Portland, OR (US); Tahir Ghani, Portland, OR (US); Owen Y. Loh, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/754,874

(22) PCT Filed: Sep. 25, 2015

(86) PCT No.: PCT/US2015/052223
§ 371 (c)(1),
(2) Date: Feb. 23, 2018

(87) PCT Pub. No.: WO2017/052587
PCT Pub. Date: Mar. 30, 2017

(65) Prior Publication Data
US 2018/0248015 A1    Aug. 30, 2018

(51) Int. Cl.
*H01L 29/51* (2006.01)
*H01L 29/78* (2006.01)
(Continued)

(52) U.S. Cl.
CPC ............ *H01L 29/517* (2013.01); *B82Y 10/00* (2013.01); *H01L 27/092* (2013.01);
(Continued)

(58) Field of Classification Search
CPC ............ H01L 29/7857; H01L 29/7851; H01L 29/7856; H01L 29/408; H01L 29/517
See application file for complete search history.

(56) References Cited

U.S. PATENT DOCUMENTS 6,586,349 B1 *   7/2003   Jeon ...................... C23C 16/029
                                                                438/785
6,720,619 B1     4/2004   Chen et al.
(Continued)

FOREIGN PATENT DOCUMENTS

CN    2704927      6/2005
CN    101064312    10/2007
(Continued)

OTHER PUBLICATIONS

International Search Report and Written Opinion received for PCT Application No. PCT/US2015/052223. dated Jun. 15, 2016. 15 pages.
(Continued)

*Primary Examiner* — Wael M Fahmy
*Assistant Examiner* — Sarah K Salerno
(74) *Attorney, Agent, or Firm* — Schwabe, Williamson & Wyatt, P.C.

(57) ABSTRACT

Techniques are disclosed for passivation of transistor channel region interfaces. In some cases, the transistor channel region interfaces to be passivated include the interface between the semiconductor channel and the gate dielectric and/or the interface between the sub-channel semiconductor material and isolation material. For example, an aluminum oxide (also referred to as alumina) layer may be used to passivate channel/gate interfaces where the channel material includes silicon germanium, germanium, or a III-V material. The techniques can be used to reduce the interface trap density at the channel/gate interface and the techniques can also be used to passivate the channel/gate interface in both (Continued)

gate first and gate last process flows. The techniques may also include an additional passivation layer at the sub-channel/isolation interface to, for example, avoid incurring additional parasitic capacitance penalty.

19 Claims, 12 Drawing Sheets

(51) Int. Cl.
H01L 29/739 (2006.01)
H01L 29/66 (2006.01)
B82Y 10/00 (2011.01)
H01L 29/06 (2006.01)
H01L 29/786 (2006.01)
H01L 27/092 (2006.01)
H01L 29/423 (2006.01)
H01L 29/775 (2006.01)
H01L 21/8238 (2006.01)
H01L 21/8258 (2006.01)

(52) U.S. Cl.
CPC ...... *H01L 29/0649* (2013.01); *H01L 29/0673* (2013.01); *H01L 29/42392* (2013.01); *H01L 29/66439* (2013.01); *H01L 29/66795* (2013.01); *H01L 29/7391* (2013.01); *H01L 29/775* (2013.01); *H01L 29/78* (2013.01); *H01L 29/785* (2013.01); *H01L 29/78696* (2013.01); *H01L 21/8258* (2013.01); *H01L 21/823807* (2013.01); *H01L 21/823821* (2013.01); *H01L 27/0924* (2013.01)

(56) References Cited

U.S. PATENT DOCUMENTS

| | | | |
|---|---|---|---|
| 8,399,934 B2* | 3/2013 | Li | H01L 21/28194 257/371 |
| 9,178,067 B1 | 11/2015 | Ching et al. | |
| 2003/0176049 A1* | 9/2003 | Hegde | H01L 29/517 438/591 |
| 2004/0135217 A1* | 7/2004 | Yamamoto | H01L 29/517 257/410 |
| 2004/0217420 A1 | 11/2004 | Yeo et al. | |
| 2005/0258491 A1 | 11/2005 | Bojarczuk, Jr. et al. | |
| 2007/0215954 A1* | 9/2007 | Mouli | H01L 21/84 257/390 |
| 2008/0121932 A1* | 5/2008 | Ranade | H01L 21/28255 257/192 |
| 2009/0042345 A1 | 2/2009 | Saxler et al. | |
| 2010/0207208 A1 | 8/2010 | Bedell et al. | |
| 2010/0301390 A1 | 12/2010 | Ko et al. | |
| 2011/0081753 A1* | 4/2011 | Yamanari | H01L 29/7833 438/216 |
| 2011/0147697 A1* | 6/2011 | Shah | B82Y 10/00 257/9 |
| 2011/0169101 A1 | 7/2011 | Doornbos et al. | |
| 2012/0319211 A1 | 12/2012 | van Dal et al. | |
| 2013/0140629 A1 | 6/2013 | Grupp et al. | |
| 2013/0285141 A1 | 10/2013 | Kuo et al. | |
| 2014/0027860 A1 | 1/2014 | Glass et al. | |
| 2014/0213037 A1 | 7/2014 | Licausi et al. | |
| 2014/0252475 A1 | 9/2014 | Xu | |
| 2014/0291726 A1 | 10/2014 | Pillarisetty et al. | |
| 2014/0374838 A1 | 12/2014 | Chen et al. | |
| 2015/0035039 A1* | 2/2015 | Li | H01L 27/1211 257/316 |
| 2015/0102386 A1 | 4/2015 | Chen et al. | |
| 2015/0129932 A1 | 5/2015 | Lin et al. | |
| 2015/0255277 A1* | 9/2015 | Tong | H01L 29/785 257/288 |
| 2017/0323955 A1* | 11/2017 | Rachmady | H01L 29/42392 |
| 2018/0108750 A1 | 4/2018 | Glass et al. | |

FOREIGN PATENT DOCUMENTS

| | | |
|---|---|---|
| CN | 102832236 | 12/2012 |
| EP | 2775528 | 9/2014 |
| WO | 2015142357 A1 | 9/2015 |
| WO | 2016209219 | 12/2016 |
| WO | 2017/052587 A1 | 3/2017 |

OTHER PUBLICATIONS

International Preliminary Report on Patentability received for PCT Application No. PCT/US2015/052223. dated Apr. 5, 2018. 11 pages.
Extended European Search Report received for EP Application No. 15904925.3, dated Apr. 3, 2019. 9 pages.
TW Office Action received for TW Application No. 105126784 dated Nov. 15, 2019, issued by the Intellectual Property Office (the IPO) with English Translation on Nov. 12, 2019, 26 pages.
TW Search Report received for TW Application No. 105126784 dated Nov. 14, 2019, 1 page.
Extended European Search Report issued for Application No. 15896512.9, dated Jan. 15, 2019. 7 pages.
International Search Report and Written Opinion received for PCT/US2015/037326. dated Mar. 24, 2016, 13 pages.
International Preliminary Report on Patentability received for PCT/US2015/037326. dated Jan. 4, 2018, 10 pages.
European Examination Report received for EP Application No. 15904925.3 dated Jul. 10, 2020, issued by the European Patent Office, 5 pages.

* cited by examiner

PASSIVATION OF TRANSISTOR CHANNEL REGION INTERFACES

CROSS-REFERENCE TO RELATED APPLICATIONS

This patent application is a U.S. National Phase Application under 35 U.S.C. § 371 of International Application No. PCT/US2015/052223, filed on Sep. 25, 2015, the entire contents of which is hereby incorporated by reference herein.

BACKGROUND

A FinFET is a transistor built around a thin strip of semiconductor material (generally referred to as the fin). The transistor includes the standard field-effect transistor (FET) nodes, including a gate, a gate dielectric, a source region, and a drain region. The conductive channel of the device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations essentially resides along the three different outer, planar regions of the fin, such a FinFET design is sometimes referred to as a tri-gate transistor. Other types of FinFET configurations are also available, such as so-called double-gate FinFETs, in which the conductive channel principally resides only along the two sidewalls of the fin (and not along the top of the fin). A nanowire transistor (sometimes referred to as a gate-all-around or nanoribbon transistor) is configured similarly to a fin-based transistor, but instead of a finned channel region where the gate is on three portions (and thus, there are three effective gates), one or more nanowires are used and the gate material generally surrounds each nanowire. There are a number of non-trivial performance issues associated with fin-based and other non-planar transistors.

DETAILED DESCRIPTION

Figure 1:
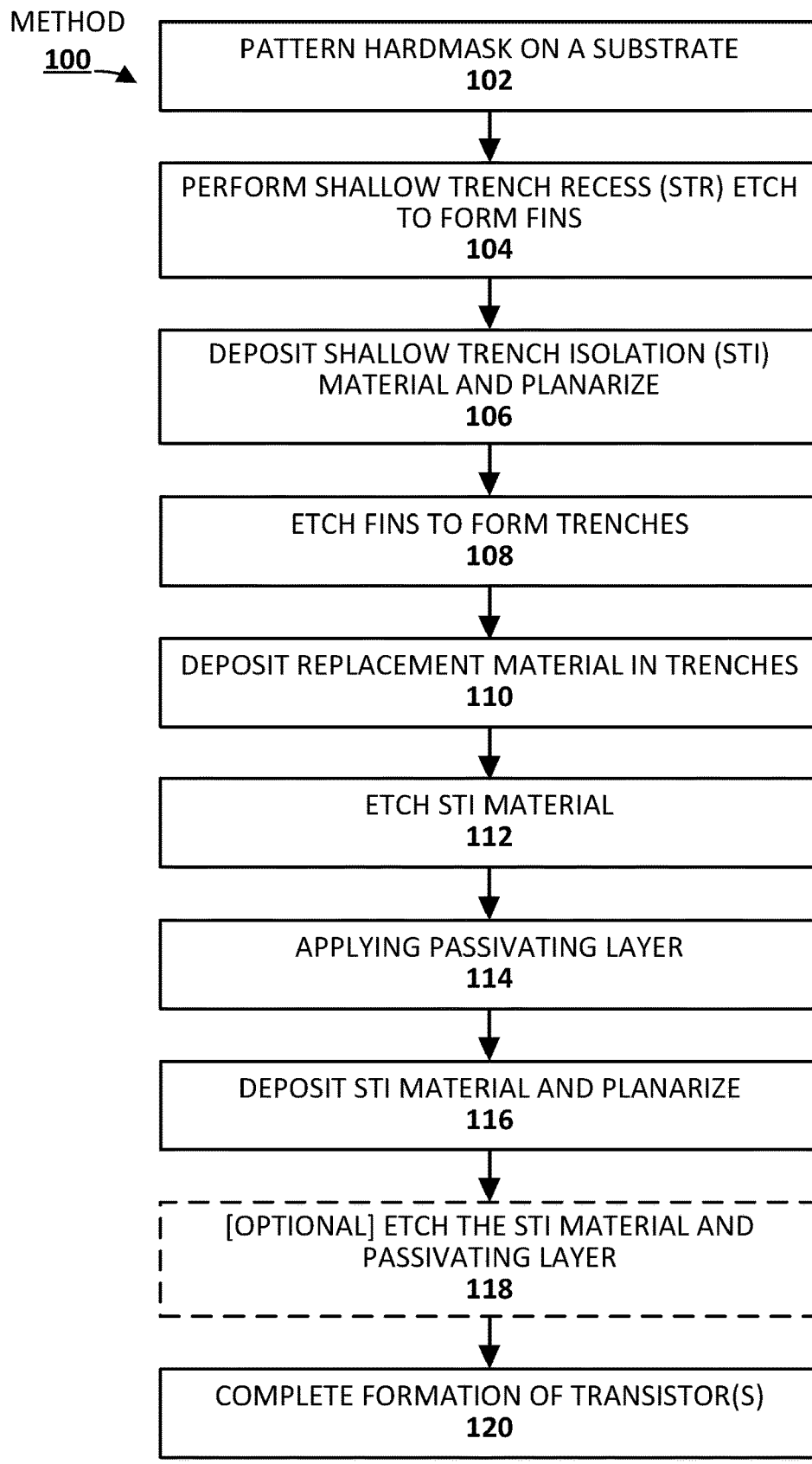
FIG. 1 illustrates a method of forming an integrated circuit, in accordance with various embodiments of the present disclosure.

Techniques are disclosed for passivation of transistor channel region interfaces. In some cases, the transistor channel region interfaces to be passivated include the interface between the semiconductor channel and the gate dielectric and/or the interface between the sub-channel semiconductor material and isolation material. In instances where the passivation techniques are applied to the channel/gate interface, a passivating layer may be deposited and used as the gate dielectric or a passivating layer may be deposited as a transition layer prior to deposition of the standard gate dielectric. For example, an aluminum oxide (also referred to as alumina) or titanium oxide (also referred to as titania) layer may be used to passivate channel/gate interfaces where the channel material includes silicon germanium, germanium, or a III-V material. In some cases, the passivation layer may include both titanium and aluminum. In some instances, the passivation layer may be doped with up to 30% of yttrium, cerium, niobium, zirconium, or hafnium, for example, or any number of metals or metal oxides with high oxidation potential (e.g., standard electrode potential of −0.5V or lower). The techniques can be used to reduce the interface trap density at the channel/gate interface and the techniques can be used to passivate the channel/gate interface in both gate first and gate last process flows. The techniques may also include an additional passivation layer at the sub-channel/isolation interface to, for example, avoid incurring additional parasitic capacitance penalty. Various example transistor geometries that can benefit from the passivation techniques described herein include, but are not limited to, field-effect transistors (FETs), metal-oxide-semiconductor FETs (MOSFETs), tunnel-FETs (TFETs), planar configurations, finned configurations (e.g., FinFET, tri-gate), and nanowire (or nanoribbon or gate-all-around) configurations. In addition, the techniques can be used to benefit p-type devices (e.g., p-MOS and p-TFET) and/or n-type devices (e.g., n-MOS and n-TFET). Further, the techniques can be used to benefit complementary metal-oxide-semiconductor (CMOS) devices or complementary tunnel-field-effect transistor (CTFET) devices. Numerous variations and configurations will be apparent in light of this disclosure.

General Overview

Silicon (Si) has useful properties that have kept it in high volume production for semiconductor devices. One such property is the ability of silicon dioxide to passivate a Si surface. Passivation in the context of Si includes that the interface trap density (fixed charge) and impurity induced charge (often mobile) can both be maintained low, such as on the order of 1E11 charges per $cm^2$, for example. Recently, non-Si channel semiconductor devices have gained an increased interest. Si channel regions are being replaced by silicon germanium (SiGe) and III-V materials due to, for example, improved electrical carrier mobility for metal-oxide-semiconductor (MOS) channel applications. However, the fixed and mobile charge densities of such SiGe and III-V replacement material channels can be hundreds or even thousands of times higher than when native Si channel material is used for Si substrates. This can lead to very large off-state currents due to high source-to-drain leakage, and thereby degrade performance or make such devices including replacement material channels nonviable. For example, at gate oxide/semiconductor interfaces and sub-channel semiconductor/isolation interfaces, if deep level traps due to dangling bonds or contamination are allowed to persist at levels above, e.g., 5E12 per $cm^2$, then leakage levels rise to unacceptable levels indicating inadequate gate control. In other words, if the density of interface traps (Dit) is too high, the transistor switch fails to adequately turn off.

Thus, and in accordance with one or more embodiments of the present disclosure, techniques are disclosed for passivation of transistor channel region interfaces. In some embodiments, the transistor channel region interfaces to be passivated include the interface between the semiconductor channel and the gate and/or the interface between the sub-channel semiconductor material and isolation material. In embodiments where the passivation techniques are applied to the channel/gate interface, a passivating layer may be deposited and used as the gate dielectric or a passivating layer may be deposited as a transition layer prior to deposition of the standard gate dielectric. In some such embodiments where the passivating layer is deposited as a transition layer prior to deposition of the standard gate dielectric, in some cases, the passivating layer may be a separate layer that is distinct from the gate dielectric layer, while in other cases, the passivating layer material may be graded into gate dielectric material. In embodiments where the passivation techniques are applied to the sub-channel/isolation material interface, a passivating layer may be deposited at the interface to, for example, avoid incurring additional parasitic capacitance penalty.

In some embodiments, the semiconductor material at the interface to be passivated may include one of SiGe and germanium (Ge) and the passivating layer material may include at least one of aluminum nitride, pure oxides and oxide alloys containing aluminum or titanium or zirconium or yttrium, silicon, and yttrium. In some embodiments, the semiconductor material at the interface to be passivated may include at least one III-V material and the passivating layer material may include at least one of aluminum oxide, hafnium oxide, and sulfur. In some embodiments, the passivation layer material that is initially deposited is designed to be consumed in a subsequent oxidation process (or otherwise oxidized), such as in the case of passivating SiGe replacement material with Si or yttrium. In some embodiments, the passivation layer material is intended to be robust as a protective layer against further oxidation, such as in the case of aluminum oxide, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate for passivating SiGe, Ge, or III-V replacement materials. In some embodiments, the passivating layer material may be selected such that the density of interface traps (Dit) is reduced in the channel region, and more specifically, at channel/gate interfaces and/or at sub-channel/isolation interfaces. In some embodiments, the passivating layer material may be selected to address the issue of broken bonds and/or impurities of replacement material fins. In some embodiments, only the channel regions of fins formed may be replaced (e.g., during a replacement gate process) and only such channel regions may be passivated using the techniques variously described herein.

The techniques may include, for example, passivating sub-fin sidewalls in transistors formed by aspect ratio trapping (ART) or similar integration schemes where non-silicon channel materials are substituted in for sacrificial silicon fins. Note that as used herein, "aspect ratio trapping" and "ART" generally include the techniques(s) of causing defects in a material to terminate on a side surface as the material grows vertically, such as non-crystalline/dielectric sidewalls, where the sidewalls are sufficiently high relative to the size of the growth area so as to trap most, if not all, of the defects. In other words, ART generally uses replacement channel techniques that include the formation of fins, removal of the fins to form shallow trench isolation (STI) trenches that are approximately the width of a single fin, and then depositing the replacement material in the approximately single fin width STI trenches. Accordingly, the ART process can allow for the growth of nominally defect free channel layers (which may include regions that later become source/drain and channel portions of a transistor). However, the problem of sub-fin leakage remains. To this end, the techniques variously described herein resolve such an issue by removing (either completely or partially) the STI material post-deposition of the replacement channel material, thereby affording an opportunity to perform passivation on the replacement channel material fins before reprocessing the STI layer. The passivation techniques may be used to chemically neutralize and/or physically protect the replacement material fins, for example. For example, the passivating material layer may reduce the mobile charge density that permits flow of current, particularly with respect to source-to-drain (or drain-to-source) leakage through ART sub-fin sidewalls in the channel region, and more specifically, under the transistor channel (the transistor channel being the portion of the replacement material in contact with the gate). In other words, the passivating layer, in some embodiments, is located at the interface of the replacement material and the STI sidewall.

In a standard ART flow, there is generally no opportunity to add a passivating material between the replacement channel material and the STI material. Therefore, the techniques variously described herein provide that opportunity by removing (either completely or partially) the STI material after the replacement material fins have been formed to allow for passivation of the replacement material. Without the passivation layer/treatment, transistors formed using ART processing and replacement material channel regions may have high source-to-drain (or drain-to-source) leakage. Such leakage can cause off-state current to be significantly high (e.g., at least three orders of magnitude higher than in structures including the passivating material layer). Further, the sub-fin portion in an ART geometry transistor would have the semiconductor channel region in direct contact with the STI material if no passivating agent/layer/treatment is present, causing unacceptably high off-state leakage current. Such leakage in structures without the passivating material layer may cause non-viability or otherwise degraded performance due to the high off-state current not providing a sufficient change relative to the on-state current. The approach of placing a passivation liner before STI deposition and immediately following STR etch is possible as well. In practice, these passivation layers have high k values, and as such, should be fabricated as thin layers to avoid causing high parasitic capacitance. This must be balanced with erosion of the passivation layer during fin etch (e.g., process 108 of method 100 described herein) and the need to maintain a certain nominal thickness value under the newly deposited fins. Numerous variations on the passivation techniques will be apparent in light of the present disclosure.

Numerous benefits of the passivation techniques as variously described herein will be apparent in light of the present disclosure. For example, generally Ge has very poor passivation properties and is difficult to passivate to density of interface traps (Dit) to below 1E13 per $cm^2$. However, the passivation techniques as variously described herein can be used to cut the density of interface traps down to levels near or below 2.5E12 $cm^2$, for example, to enable high mobility channel materials of SiGe alloys and Ge while maintaining acceptable leakage levels. As can be understood, the passivation layers variously described herein provide benefits over silicon oxide transition layers between SiGe, Ge, or III-V channel region material and either the gate dielectric or STI, because such passivation layers significantly reduce Dit. This in turn enables low leakage and allows transistor devices including such SiGe, Ge, and III-V replacement channel materials to adequately turn off. In some embodiments, the passivating techniques can improve source-to-drain (or drain-to-source) leakage through sub-channel or sub-fin sidewalls.

Upon analysis (e.g., using scanning/transmission electron microscopy (SEM/TEM), composition mapping, secondary ion mass spectrometry (SIMS), time-of-flight SIMS (ToF-SIMS), atom probe imaging, local electrode atom probe (LEAP) techniques, 3D tomography, high resolution physical or chemical analysis, etc.), a structure or device configured in accordance with one or more embodiments will effectively show a passivating layer as variously described herein. For example, in some cases, a passivating layer may be located at a transistor channel/gate interface, such as between the channel material and gate electrode material (e.g., in embodiments where the passivating layer is used as a gate dielectric) or between the channel material and the gate dielectric material (e.g., in embodiments where the passivating layer is a transitional layer deposited prior to the gate dielectric), as will be apparent in light of the structures discussed herein. Further, in some cases, a passivating layer may be located at a transistor sub-channel/isolation interface, such as between sub-fin material and STI material. In addition, in some cases, one or more passivating layers may be located in the channel region and source/drain regions of a transistor formed using the techniques described herein. In other cases, one or more passivating layers may be located only in the channel region of transistors formed using the techniques described herein. In some cases, the techniques may be detected by observing the improvement gained in off-state current due to a reduction in source-to-drain (or drain-to-source) leakage as a result of the inclusion of a passivating layer variously described herein. Numerous configurations and variations will be apparent in light of this disclosure.

Architecture and Methodology

FIG. 1 illustrates a method 100 of forming an integrated circuit, in accordance with one or more embodiments of the present disclosure. FIGS. 2A-L illustrate example integrated circuit structures that are formed when carrying out method 100 of FIG. 1, in accordance with various embodiments. As will be apparent in light of the structures formed, method 100 discloses techniques for forming a passivating layer at sub-fin (or sub-channel)/isolation interfaces of a transistor. The passivating layer can provide numerous benefits, as variously described herein. The structures of FIGS. 2A-L are primarily depicted and described herein in the context of forming finned transistor configurations (e.g., FinFET or tri-gate), for ease of illustration. However, the techniques can be used to form transistors of any suitable geometry or configuration, depending on the end use or target application. For example, FIG. 3A illustrates an example integrated circuit structure including nanowire configurations, as will be discussed in more detail below. As previously described, the techniques can also be used to passivate transistor channel/gate interfaces, as will be described below with reference to FIGS. 4A-D. Accordingly, transistor devices can benefit from passivating layers at channel/gate interfaces and/or at sub-channel/isolation interfaces, as will be apparent in light of the present disclosure. Various example transistor geometries that can benefit from the techniques described herein include, but are not limited to, field-effect transistors (FETs), metal-oxide-semiconductor FETs (MOSFETs), tunnel-FETs (TFETs), planar configurations, finned configurations (e.g., FinFET, tri-gate), and nanowire (or nanoribbon or gate-all-around) configurations. In addition, the techniques can be used to benefit p-type devices (e.g., p-MOS and p-TFET) and/or n-type devices (e.g., n-MOS and n-TFET). Further, the techniques may be used to form complementary MOS (CMOS) and/or complementary TFET (CTFET) transistors/devices/circuits, where either or both of the included p-type and n-type transistors may benefit from the passivating techniques variously described herein.

Figure 2A:
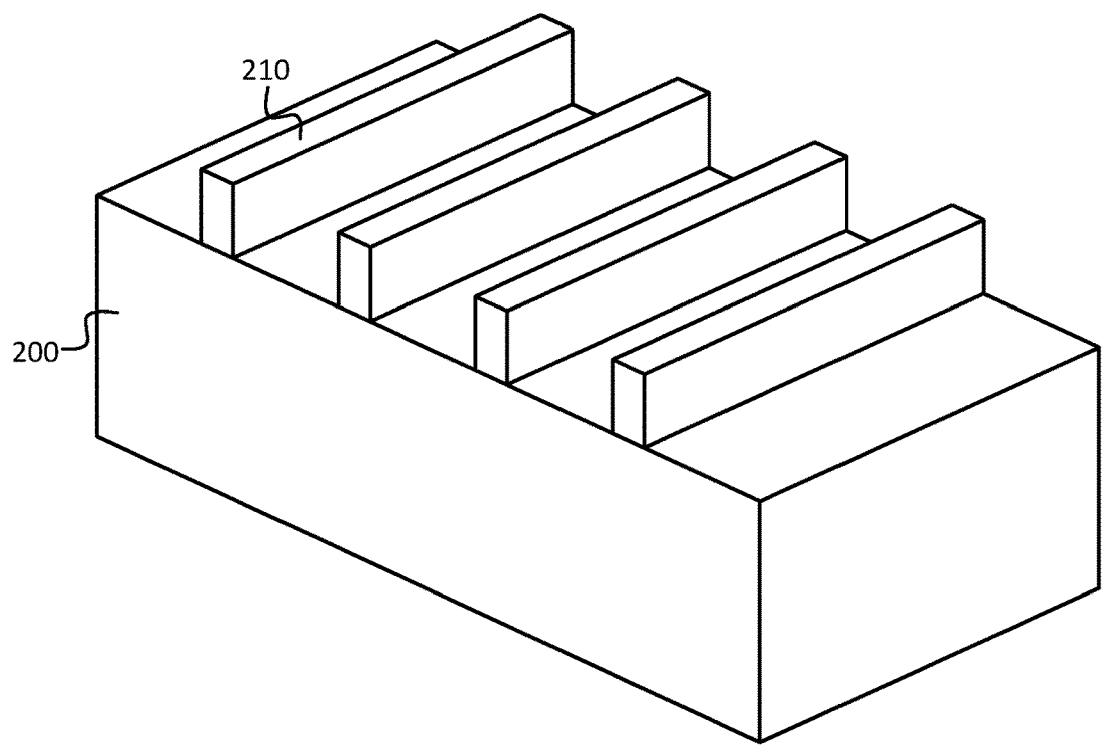
FIGS. 2A-L illustrate example structures that are formed when carrying out the method of FIG. 1, in accordance with various embodiments of the present disclosure.
Figure 3A:
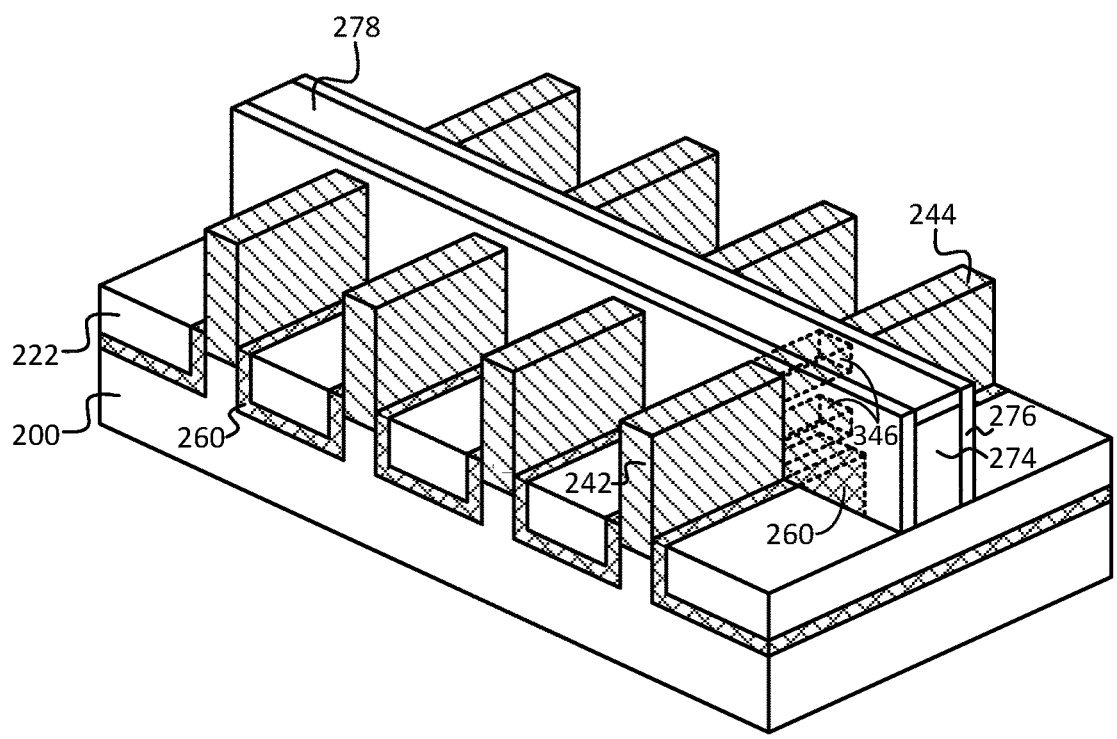
FIGS. 3A-C illustrate variations on the structure of FIG. 2L formed using the method of FIG. 1, in accordance with various embodiments of the present disclosure.

As can be seen in FIG. 1, method 100 includes patterning 102 hardmask 210 on a substrate 200 to form the example resulting structure shown in FIG. 2A, in accordance with an embodiment. In some embodiments, substrate 200 may be: a bulk substrate including, e.g., Si, SiGe, Ge, and/or at least one III-V material; an X on insulator (XOI) structure where X is Si, SiGe, Ge, and/or at least one III-V material and the insulator material is an oxide material or dielectric material or some other electrically insulating material; or some other suitable multilayer structure where the top layer includes Si, SiGe, Ge, and/or at least one III-V material. In some embodiments, the top layer may include a plurality of multilayer materials, which may be useful for nanowire applications, for example. Hardmask 210 on substrate 200 can be deposited using any suitable technique. For example, hardmask 210 may be blanket deposited or grown on substrate 200 using chemical vapor deposition (CVD), atomic layer deposition (ALD), physical vapor deposition (PVD), spin-on processing, and/or any other suitable process to form hardmask 210 on substrate 200. In some instances, the surface of substrate 200 to be deposited on may be treated (e.g., chemical treatment, thermal treatment, etc.) prior to deposition of hardmask 210. Hardmask 210 can be patterned 102 using any suitable techniques, such as one or more lithography and etch processes, for example. Hardmask 210 may be comprised of any suitable material, such as various oxide or nitride materials, for example. Specific oxide and nitride materials may include silicon oxide, titanium oxide, hafnium oxide, aluminum oxide, silicon nitride, or titanium nitride, just to name a few. In some cases, the hardmask 210 material may be selected based on the substrate 200 material used.

Figure 2B:
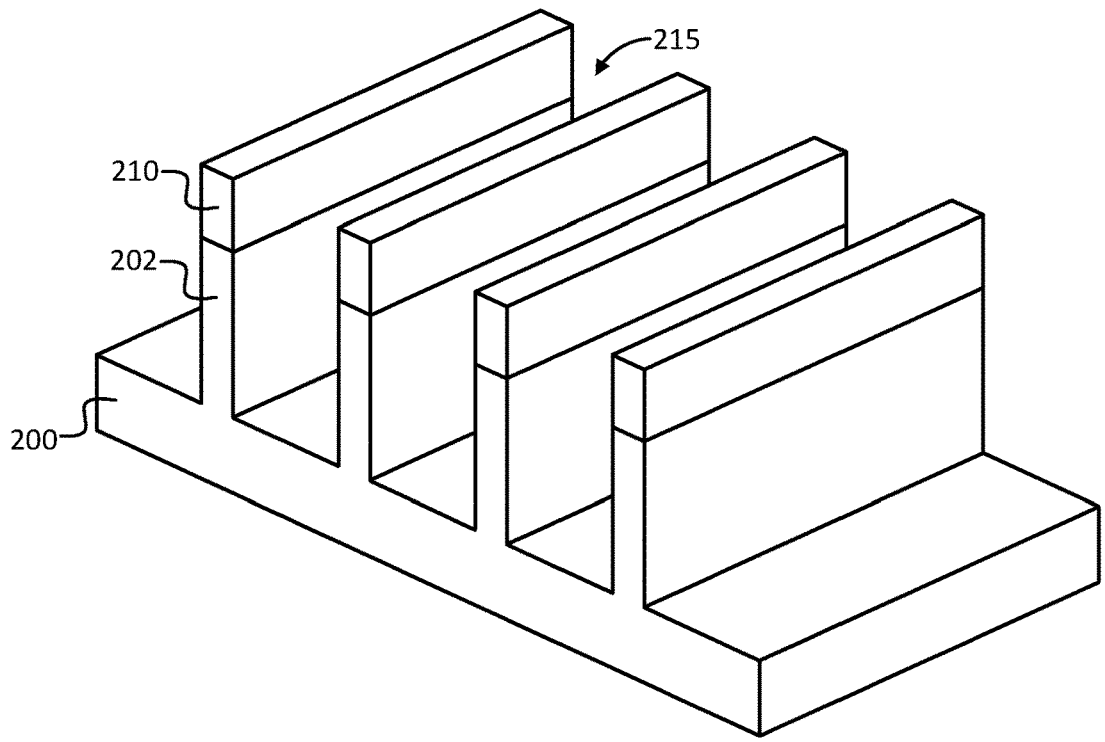

Method 100 of FIG. 1 continues with performing 104 shallow trench recess (STR) etch to form fins 202 from substrate 200, thereby forming the resulting example structure shown in FIG. 2B, in accordance with an embodiment. The STR etch 104 used to form trenches 215 and fins 202 may include any suitable techniques, such as various masking processes and wet and/or dry etching processes, for example. In some cases, STR etch 104 may be performed in-situ/without air break, while in other cases, STR etch 104 may be performed ex-situ. Trenches 215 may be formed with varying widths and depths based on the end use or target application. For example, multiple hardmask patterning 102 and etching 104 processes may be performed to achieve varying depths in the STR trenches 215. Fins 202 may be formed to have varying widths and heights. For example, in an aspect ratio trapping (ART) integration scheme, the fins may be formed to have particular height to width ratios such that when they are later removed or recessed, the resulting trenches formed allow for defects in the replacement material deposited to terminate on a side surface as the material grows vertically, such as non-crystalline/dielectric sidewalls, where the sidewalls are sufficiently high relative to the size of the growth area so as to trap most, if not all, of the defects. In such an example case, the height to width ratio (h/w) of the fins may be greater than 1, such as 1.5 to 3, for example. Note that the trenches 215 and fins 202 are shown as having the same width and depth/height in this example structure for ease of illustration; however, the present disclosure is not intended to be so limited. Further note that although four fins 202 are shown in the example structure, any number of fins may be formed, such as one, two, ten, hundreds, thousands, millions, etc., depending on the end use or target application.

Figure 2C:
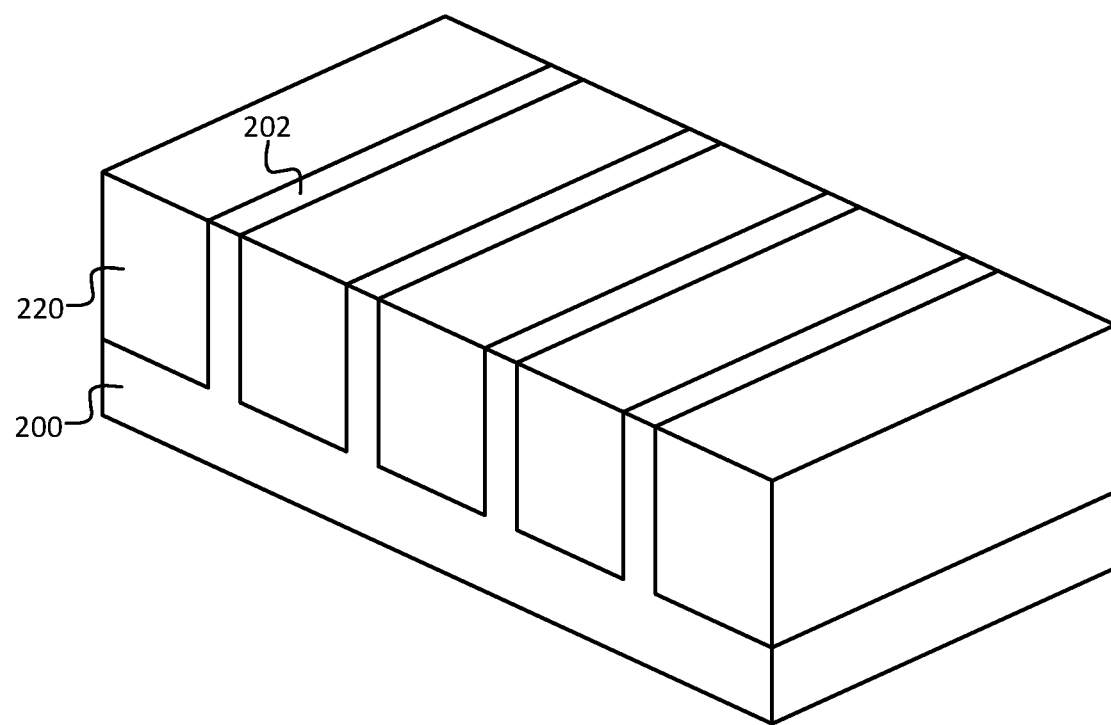

Method 100 of FIG. 1 continues with depositing 106 shallow trench isolation (STI) material 220 and planarizing to form the resulting example structure shown in FIG. 2C, in accordance with an embodiment. In some embodiments, deposition 106 of STI material 220 may include any deposition process described herein (e.g., CVD, ALD, PVD, etc.), or any other suitable deposition process. STI material 220 may include any suitable insulating material, such as one or more dielectric, oxide (e.g., silicon dioxide), or nitride (e.g., silicon nitride) materials. In some embodiments, the STI material 220 may selected based on the substrate material 200. For example, in the case of a Si substrate 200, STI material 220 may be silicon dioxide or silicon nitride. Recall that the passivation techniques variously described herein include a first STI material deposition, removal or recess (e.g., partial removal) of that first STI material, coating with a passivating material, and then depositing a second STI material to reprocess the STI layer. Therefore, in this example embodiment, deposition 106 is the first STI material deposition, which will be subsequently removed or recessed, as discussed in more detail below. Note that although the passivation techniques include first and second STI material depositions, the STI material used for each deposition may comprise the same materials or different materials, depending on the particular configuration.

Figure 2D:
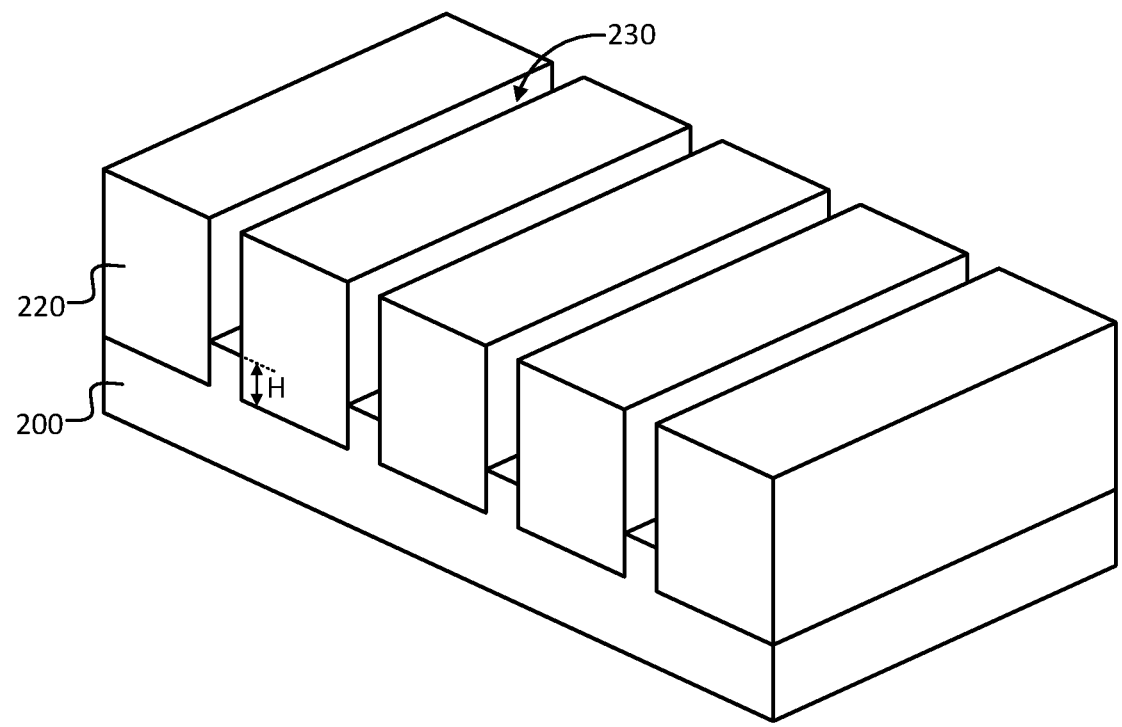

Method 100 of FIG. 1 continues with etching 108 fins 202 to form trenches 230, thereby forming the resulting example structure shown in FIG. 2D, in accordance with an embodiment. Etch 108 may be performed using any suitable techniques, such as various masking processes and wet and/or dry etching processes, for example. The etch 108 performed in this example embodiment caused a recess of fins 202, such that a portion of the bottom of fins 202 (which were formed from substrate 200 and are comprised of the same native material) having a height H are still present between the STI material 220. In some embodiments, etch 108 may cause the removal of the entirety of fins 202, such that H is 0, or etch 108 may be performed such that it removes material below the bottom of the STI layer 220 and into the substrate 200, for example. Trenches 230 can be used for the deposition of a replacement material, as will be discussed in more detail below. Note that during ART processing, trenches 230 may include high aspect ratio openings, to trap dislocations, for example, preventing the dislocations from reaching the epitaxial film surface, and greatly reducing the surface dislocation density within the trenches 230.

Figure 2E:
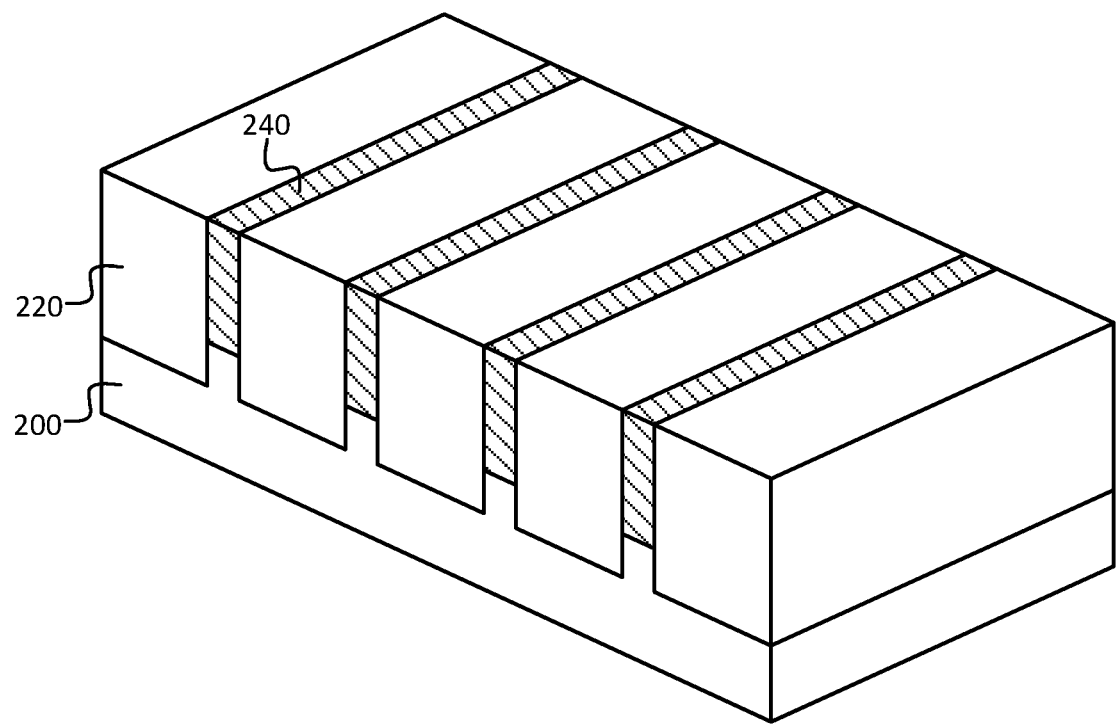

Method 100 of FIG. 1 continues with depositing 110 replacement material 240 in trenches 230 and planarizing to form the resulting example structure shown in FIG. 2E, in accordance with an embodiment. Deposition 110 can be followed by a planarization process to, for example, address protruding facets where present. Deposition 110 may be performed using any deposition process described herein (e.g., CVD, ALD, LPE, PVD, MBE, etc.), or any other suitable deposition process. In some cases, deposition 110 may be performed in-situ/without air break, while in other cases, deposition 110 may be performed ex-situ. In some cases, the deposition 110 techniques used may depend upon the material 240 being deposited. As can be seen in the structure of FIG. 2E, deposition 110 forms fins including replacement material 240. As will be discussed in more detail below, replacement material 240 fins can be used for the formation of one or more transistors, where the fins 240 are used to form the channel region of the transistor(s), and in some cases, also used to form the source and drain regions of the transistor(s).

In some embodiments, replacement material 240 may include any suitable semiconductor material different from the substrate material 200. For example, replacement material 240 may be Si, SiGe, Ge, and/or at least one III-V material. In some embodiments, substrate 200 may be Si and replacement material 240 may be SiGe, Ge, and/or at least one III-V material. For example, in embodiments where replacement material 240 is $Si_{1-x}Ge_x$, x may range from 0.01 to 1 (e.g., 0.2<x<0.8, to provide an example range). Therefore, in some embodiments, the replacement material may be Ge by itself or as a layer in the SiGe material (e.g., if the SiGe was deposited in a graded manner with increasing Ge content). In another example embodiment, the replacement material 240 may be one or more III-V materials. Example III-V materials, as variously used herein, can include gallium arsenide (GaAs), indium phosphide (InP), indium arsenide (InAs), indium gallium arsenide (InGaAs), aluminum arsenide (AlAs), or indium aluminum arsenide (InAlAs), or any other suitable III-V material. In some embodiments, if replacement material 240 is one or more III-V replacement materials, the material may include a single layer or a multilayer stack of III-V materials, such as InP/InGaAs/InAs, GaAs/InP/InAs, GaAs/InGaAs/InAs, GaAs/InAlAs/InAs, InP/InGaAs/InP, GaAs/InAs, GaAs/InGaAs, or InP/InGaAs, or any other suitable multilayer stack including two or more III-V materials. In some such embodiments where replacement material 240 is a III-V multilayer stack, a high bandgap III-V material may be used near the bottom of the stack (e.g., to help reduce leakage current to ground), such as GaAs, InP, InAlAs, or AlAs, for example. Further, in some such embodiments, a III-V multilayer stack may employ a low bandgap III-V material near the top of the stack (e.g., to help with making contact to the stack), such as InAs or InGaAs, for example. The materials discussed herein may be strained and/or doped in any suitable manner depending on the end use or target application.

Figure 2F:
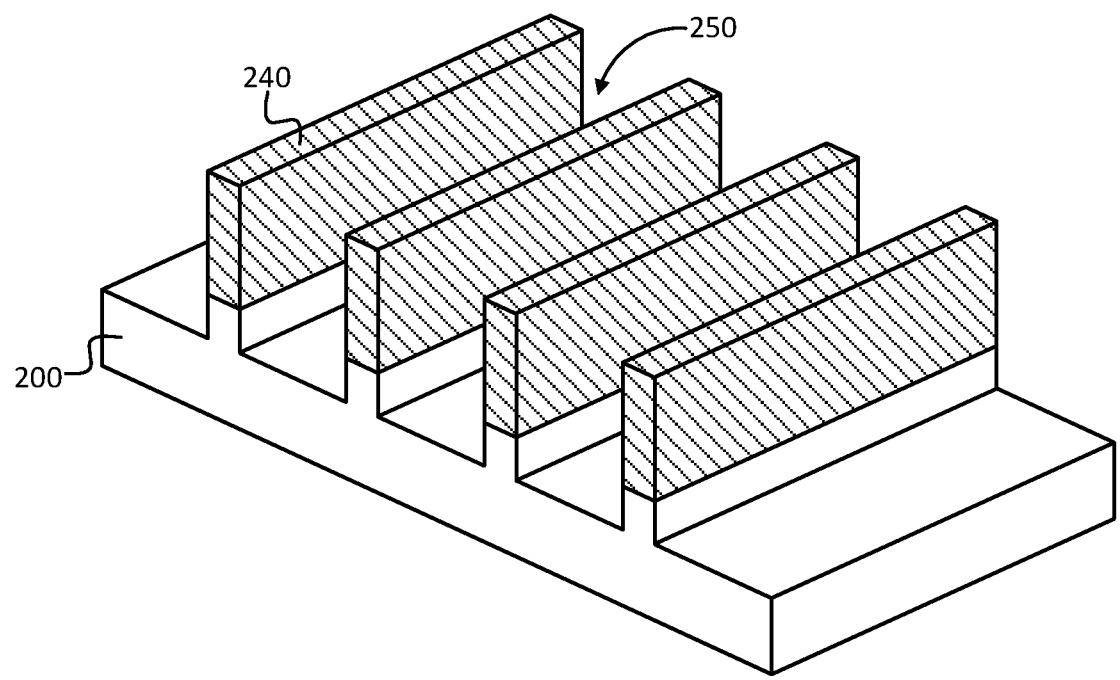

Method 100 of FIG. 1 continues with etching 112 STI material 220 to form trenches 250, thereby forming the resulting example structure shown in FIG. 2F, in accordance with an embodiment. Etch 112 may include any suitable technique, such as various masking processes and wet and/or dry etching processes, for example. In some cases, etch 112 may be performed in-situ/without air break, while in other cases, etch 112 may be performed ex-situ. In some embodiments, etch 112 may completely remove the first STI material 220 that was deposited, as is the case with the example embodiment illustrated by the structure of FIG. 2F. In other embodiments, etch 112 may only recess or partially remove the first STI material 220, leaving a portion of the material at the bottom of trenches 250, as will be discussed in more detail with reference to FIG. 2K', for example. In some embodiments, processes 106-112 may not be needed, such as in the case where the method begins with a multilayer substrate including a blanket layer of the replacement material on a bulk substrate. In such embodiments, ART processing would not be employed. For example, process 102 of method 100 may begin with a substrate such as a bulk Si substrate that includes one or more layers of SiGe or Ge or III-V deposited thereon. It can be understood, in such an example case, that formation of fins 104 would be performed in the replacement material, with the replacement material layer(s) including the active channel regions of the transistors. Similar passivation materials and passivation processes as described herein can be used for such alternative process flows, as will be apparent in light of the present disclosure.

Figure 2G:
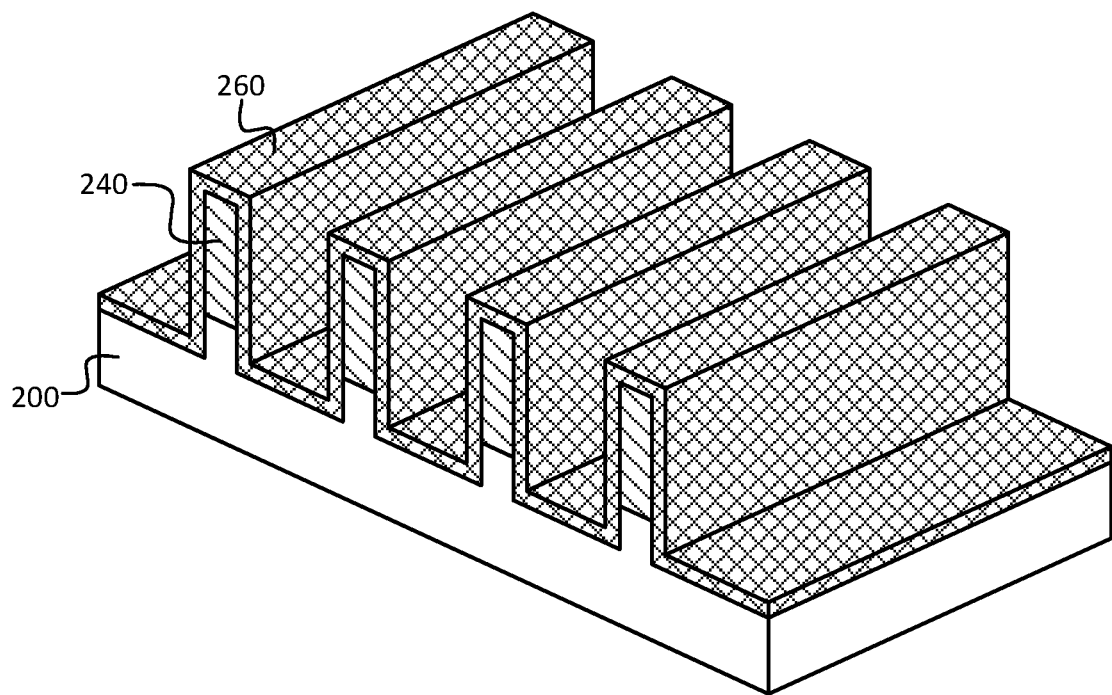

Method 100 of FIG. 1 continues with applying 114 passivating layer 260 to form the resulting example structure shown in FIG. 2G, in accordance with an embodiment. Application 114 may be performed using any deposition process described herein (e.g., CVD, ALD, LPE, PVD, MBE, etc.), thermal evaporation techniques, or any other suitable deposition process. In some cases, application 114 may be performed in-situ/without air break, while in other cases, application 114 may be performed ex-situ. In some cases, the application 114 techniques used may depend upon the material 260 being deposited. Note that although application 114 is discussed herein as depositing a passivating layer 260, application 114 may include and/or alternatively consist of other passivation techniques, such as a applying a passivating agent or treatment to the structure of FIG. 2F. Therefore, although passivating layer 260 is depicted as a distinct layer in the example embodiment of FIG. 2G, application 114 (or the particular passivation process used) may only or also cause a physical and/or chemical change at the surface of the exposed layers (e.g., at the surface of replacement material fins 240 and/or substrate 200). In other words, passivation layer 260 may be detectable as a portion of the outside walls of replacement material fins 240 instead of being a distinct layer as shown in FIG. 2G, for example. However, in FIG. 2G, passivation layer 260 is depicted as a single layer, and such a single layer may include the same material throughout or have one or more components graded throughout the layer from a first concentration to a second concentration. Also note that although passivation layer 260 is depicted as a single layer, passivation application 114 may include a plurality of passivation layers 260, depending on the end use or target application.

Figure 2H:
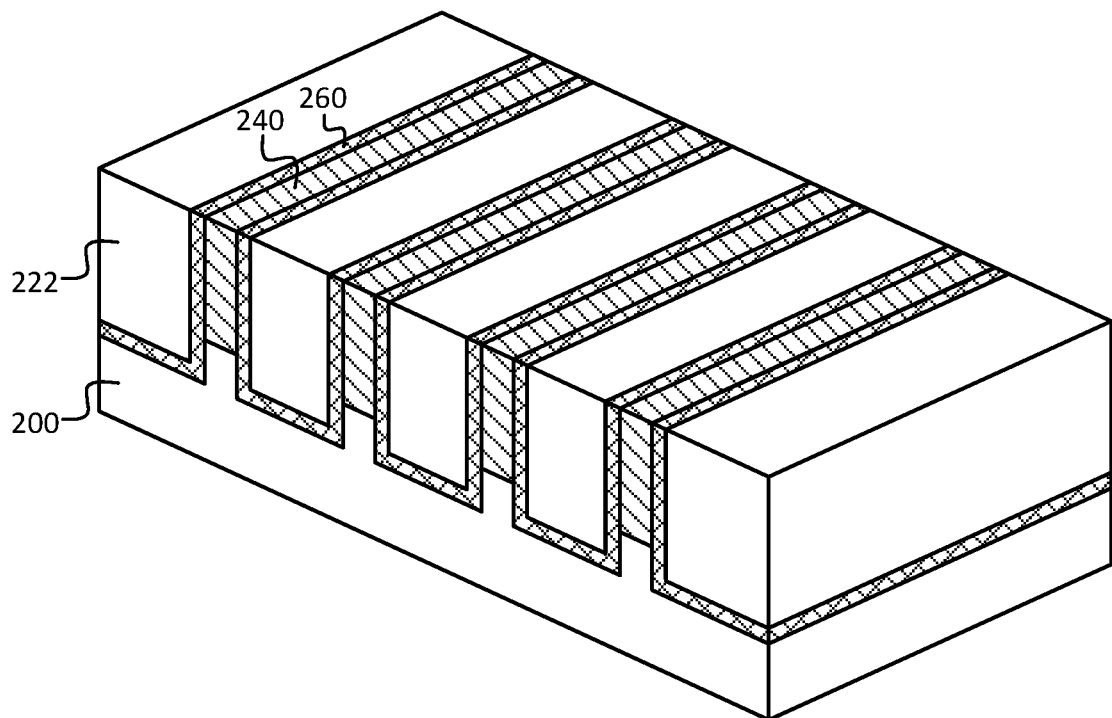

Method 100 of FIG. 1 continues with depositing 116 second STI material 222 and planarizing, to form the resulting example structure shown in FIG. 2H, in accordance with an embodiment. As can be seen, the second STI material fills the portion of the trenches 250 that still existed after passivating layer 260 was deposited. Deposition 116 may be performed using any deposition process described herein (e.g., CVD, ALD, PVD, spin-on processing, etc.), or any other suitable deposition process. In some cases, deposition 116 may be performed in-situ/without air break, while in other cases, deposition 116 may be performed ex-situ. Recall that although STI material 222 is referred to as the second STI material, it may include the same material as the first STI material 220. Accordingly, the first and second designations are intended to refer to the order in which they are deposited during method 100. Therefore, the STI material may be re-deposited 116 if the second STI material 222 is the same as the first STI material 220. However, in some embodiments, the first and second STI materials 220 and 222 may be different. As can also be seen in FIG. 2H, after the planarization process, at least one surface of the replacement material 240 fins may be exposed (e.g., the top surface in this example case) and the passivating layer 260 is located between the at least a portion of the replacement material fins 240 and the second STI material 222. Also note that the passivating layer 260 is located between the substrate 200 and the second STI material 222.

In some embodiments, passivating layer 260 may have any arbitrary or desired thickness, such as a thickness of 1-10 nm, or some other suitable thickness depending on the end use or target application. In some embodiments, passivating layer 260 may be deposited to have a substantially conformal growth pattern. Such a substantially conformal growth pattern may include that the thickness of a portion of the passivating layer 260 between the replacement material fins 240 and second STI material 222 may is substantially the same (e.g., within 1 or 2 nm tolerance) as the thickness of a portion of the passivating layer between the substrate 200 and the second STI material 222, for example.

In some embodiments, passivating layer 260 may include any suitable material that is different from the second STI material 222. In some embodiments, the passivating layer 260 material used may be selected based on the second STI material 222 used. In some embodiments, the passivating layer 260 may be selected based on the replacement material 240 deposited during process 110. For example, passivating layer 260 may be selected such that the density of interface traps (Dit) is reduced in the sub-channel (or sub-fin) region of a resulting transistor(s) formed using the techniques described herein. In such an example, the passivating layer can improve source-to-drain (or drain-to-source) leakage through the sub-fin sidewall(s) in the channel region, and more specifically, under the transistor channel (the transistor channel being the portion of the replacement material in contact with the gate). In other words, the passivating layer, in some embodiments, is located at the interface of the replacement material and the STI sidewall. Accordingly, the passivating layer 260 material may be selected to address the issue of broken bonds and/or impurities of replacement material fins 240. In embodiments where the replacement material 240 is Si, the passivating material 260 may include silicon nitride and/or silicon dioxide. In embodiments where the replacement material 240 is SiGe or Ge, the passivating material 260 may include Si, pure oxides and oxide alloys containing aluminum or titanium or zirconium or yttrium, aluminum nitride, and/or yttrium, for example. In embodiments where the replacement material 240 is one or more III-V materials, the passivating material 260 may include aluminum oxide, hafnium oxide, and/or sulfur (e.g., InGaAs replacement material and a sulfur passivation material). Numerous other replacement material 240 and passivating material 260 combinations will be apparent in light of this disclosure. In some embodiments, the passivation layer material 260 that is initially deposited is designed to be consumed in a subsequent oxidation process (or otherwise oxidized), such as in the case of applying Si or yttrium on SiGe replacement material. In some embodiments, the passivation layer material 260 is intended to be robust as a protective layer against further oxidation, such as in the case of aluminum oxide or hafnium oxide (or other suitable materials having a high dielectric constant K) for III-V replacement materials.

Figure 2I:
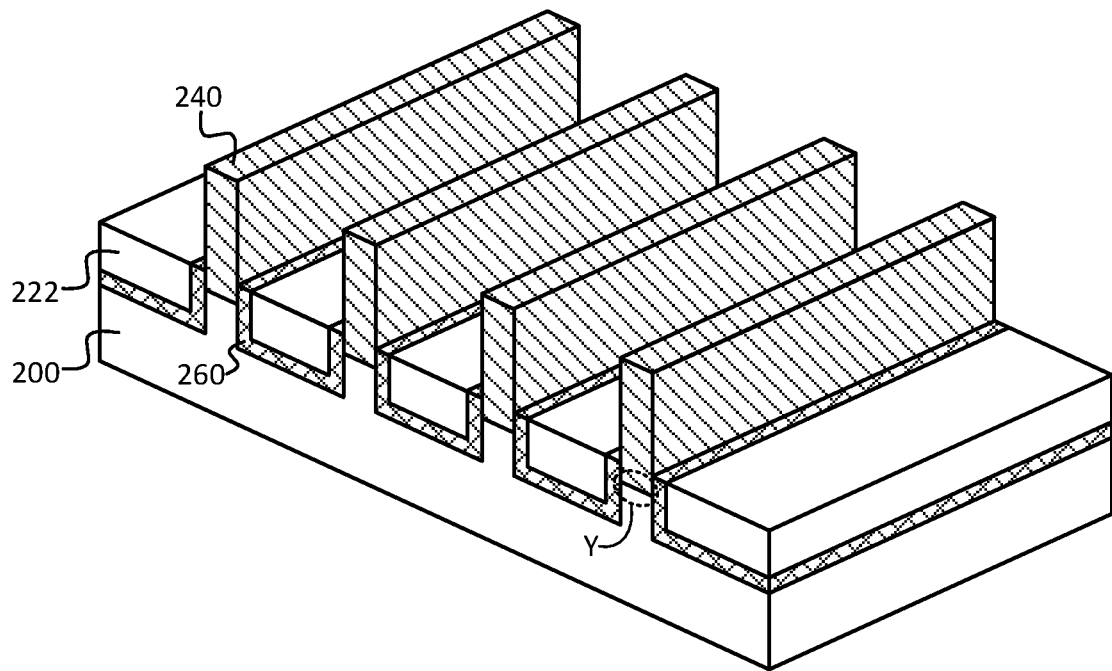

Method 100 of FIG. 1 optionally continues with etching 118 the STI material 222 and passivating layer 260, to form the resulting example structure shown in FIG. 2I, in accordance with an embodiment. Etch 118 may be performed using any suitable techniques, such as various masking processes and wet and/or dry etching processes, for example. In some cases, etch 118 may be performed in-situ/without air break, while in other cases, etch 118 may be performed ex-situ. In this example embodiment, etch 118 removes second STI material 222 and passivating layer 260 such that replacement material fin 240 protrudes from the plane, which can be performed for fabricating transistors having non-planar configurations (e.g., finned or nanowire/nanoribbon configurations), for example. Note that although there is overlap between the replacement material fin 240 and the passivating layer 260, such an overlap may be greater or lesser than the amount shown. Further, in some cases, no overlap may exist, such that the passivating layer 260 and second STI material 222 is etched/recessed 118 to a level that is below the Y interface located between the native material portion of the fin and the replacement material portion. In the case of fabricating transistors having planar configurations, etch 118 may not be performed and the structure shown in FIG. 2H may be used as the integrated circuit structure from which one or more transistors are formed.

Figure 2J:
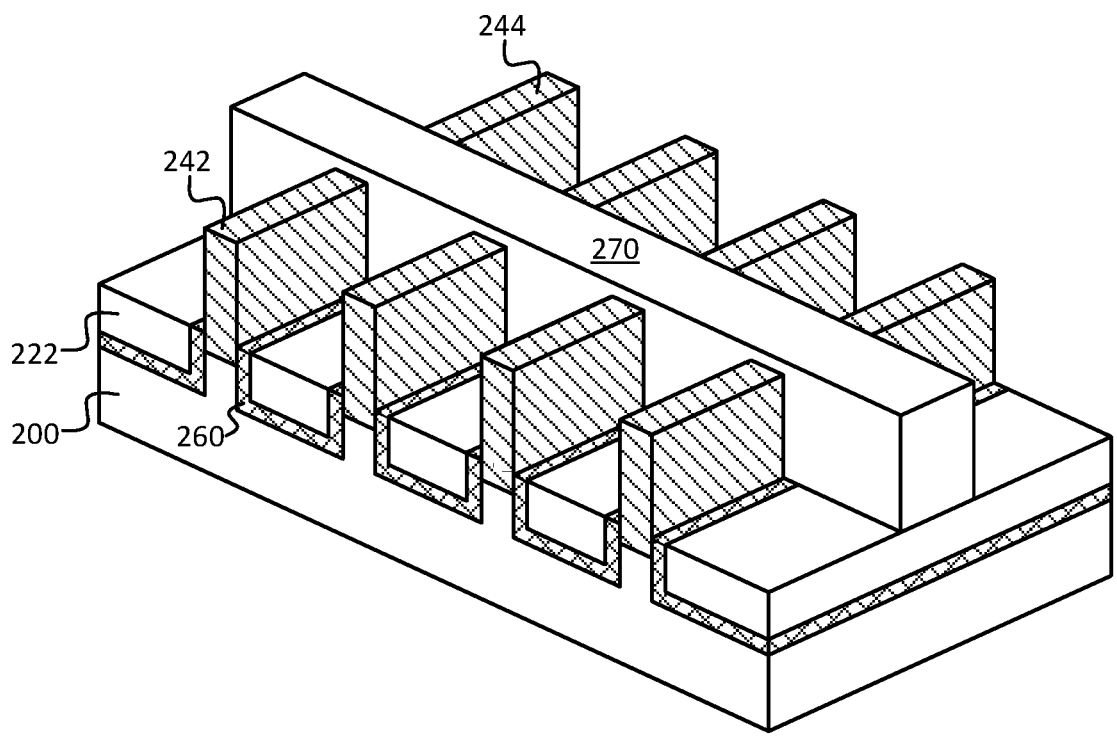
Figure 2K:
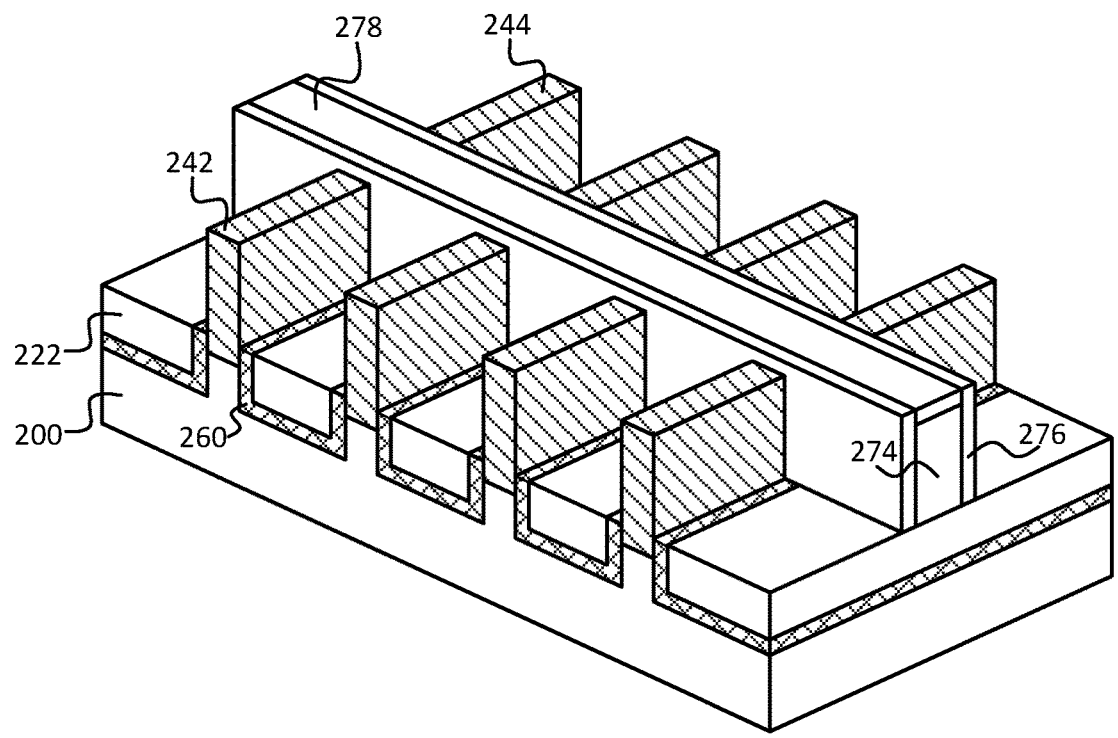
Figure 2K:
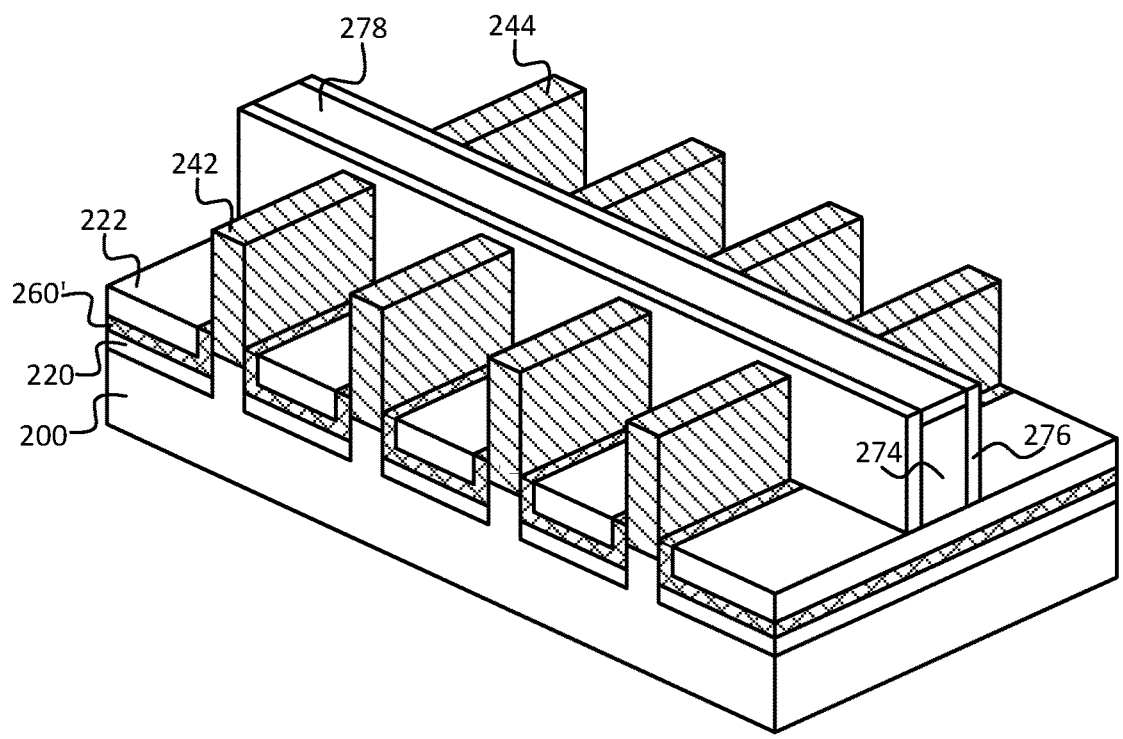
Figure 2L:
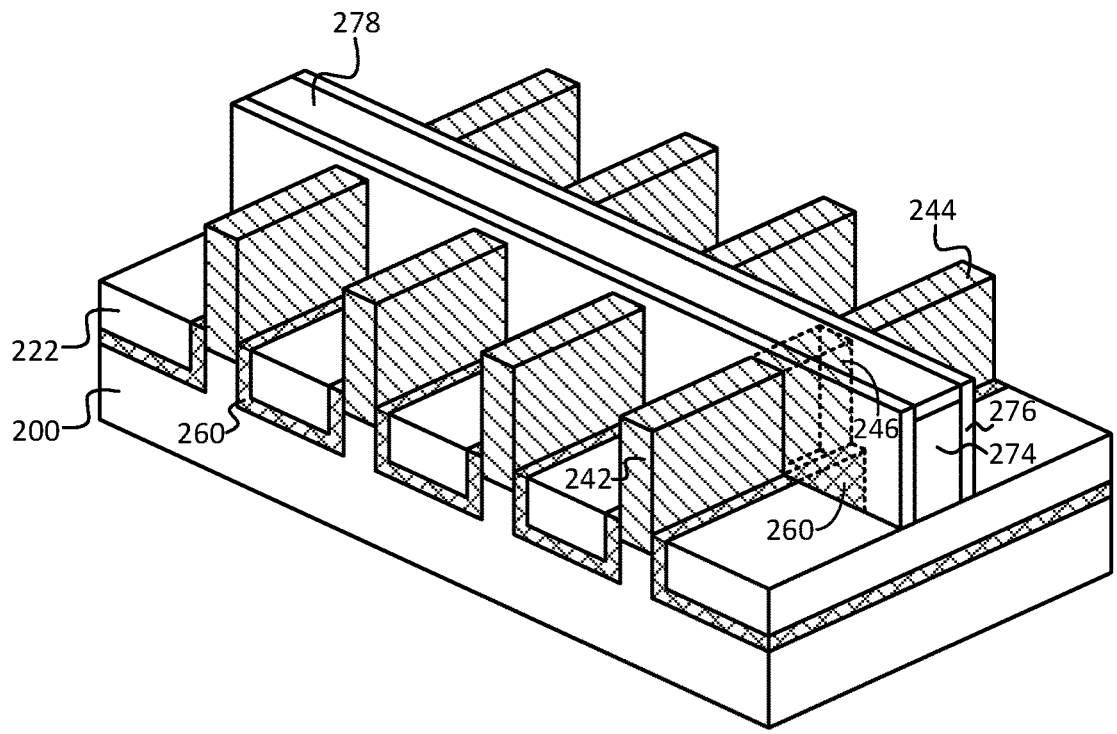

Method 100 of FIG. 1 continues with completing 120 the formation of one or more transistors to form the example resulting structures of FIGS. 2J-L, in accordance with some embodiments. Various different processes can be performed to complete 120 the formation of one or more transistors using the integrated circuit structures of FIGS. 2H (e.g., for planar transistor configurations) and 2I (e.g., for non-planar transistor configurations). Continuing from the structure of FIG. 2I, some such processes may include forming a gate stack 270 on the replacement material fins 240, to form the resulting example structure shown in FIG. 2J, in accordance with an embodiment. In some embodiments, the formation of gate stack 270 may include dummy gate oxide deposition, dummy gate electrode (e.g., poly-Si) deposition, and patterning hardmask deposition. Additional processing may include patterning the dummy gates and depositing/etching spacer material. Following such processes, the method may continue with insulator deposition, planarization, and then dummy gate electrode and gate oxide removal to expose the channel region of the transistors, such as is done for a replacement metal gate (RMG) process. Following opening the channel region, the dummy gate oxide and electrode may be replaced with, for example, a hi-k dielectric and a replacement metal gate, respectively. Other embodiments may include a standard gate stack formed by any suitable process. Any number of standard back-end processes may also be performed to help complete 120 the formation of one or more transistors.

In the example structure shown in FIG. 2K, the gate stack 270 includes gate electrode 274 and a gate dielectric (not shown for ease of illustration) formed directly under gate electrode 274. The gate dielectric and gate electrode may be formed using any suitable technique and from any suitable materials. For example, the gate stack may have been formed during a replacement metal gate process, as previously described, and such a process may include any suitable deposition technique (e.g., CVD, PVD, ALD, etc.). The gate dielectric may be, for example, any suitable oxide such as silicon dioxide or high-k gate dielectric materials. Examples of high-k gate dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used. In general, the thickness of the gate dielectric should be sufficient to electrically isolate the gate electrode from the source and drain contacts. Further, the gate electrode 274 may comprise a wide range of materials, such as polysilicon, silicon nitride, silicon carbide, or various suitable metals or metal alloys, such as aluminum (Al), tungsten (W), titanium (Ti), tantalum (Ta), copper (Cu), titanium nitride (TiN), or tantalum nitride (TaN), for example. As can also be seen, spacers 276 may be formed to, for example, protect the gate stack during subsequent processing. A hardmask 278 can also be formed to protect the gate stack form subsequent processing.

The gate stack 270 can be used to define channel regions as well as source and drain regions of subsequently formed transistors, where the channel region is underneath the gate stack and the source/drain (S/D) regions are located on either side of the channel region (in other words, the S/D regions are adjacent to the channel region). For example, the portion of fins 240 underneath gate stack 270 in FIG. 2J can be used for transistor channel regions and the portion of the fins indicated as 242 and 244 on either side of gate stack 270 can be used for transistor S/D regions. Note that 242 can be used either for the source region or the drain region, and 244 can be used for the other region, based on the resulting configuration. Accordingly, once the gate stack is fabricated, the S/D regions 242 and 244 can be processed. The S/D regions 242 and 244 of the fins are formed in the fin regions on either side of the gate stack, as normally done (e.g., ion implantation, or etch and deposition with in situ doping, or any other suitable source/drain forming process). Contacts may be formed on those source/drain regions using, for example, a silicidation process (generally, deposition of contact metal and subsequent annealing to reduce contact resistance). Typical S/D region materials include, for example, Si, SiGe, Ge, and/or III-V compounds, to name a few example materials, which can be doped as needed to provide the desired polarity. Example source drain contact materials include, for example, tungsten, titanium, silver, gold, aluminum, copper, cobalt, and alloys thereof.

FIG. 2K' is provided to illustrate an alternative example structure where the first STI material 220 is not completely removed during etch 112, in accordance with an embodiment. As was previously described, in some cases, etch 112 may be a partial etch that leaves some of the first STI material 220 in the STR trenches. In such an example case, the passivation layer 260' is deposited on the recessed first STI material 220 in the STR trenches as opposed to being directly deposited on substrate 200 (e.g., compare the structure of FIG. 2K' with the structure of FIG. 2K). Note that passivation layer 260' is similar to passivation layer 260 as variously described herein, except that passivation layer 260' is deposited on the structure that includes first STI material 220, as just described. Such an example structure that retains a portion of the first STI material 220 and forms passivating layer 260' as a sandwiched structure between the first and second STI materials 220 and 222 may be utilized as desired depending on the end use or target application.

FIG. 2L is provided to illustrate one of the channel regions 246 under the gate, in accordance with an example embodiment. As can be seen in the example structure of FIG. 2L, the original finned configuration was maintained in channel region 246. However, the structure of FIG. 2L may also be achieved by replacing the channel region with a finned structure during a replacement gate process (e.g., an RMG process). In such finned configurations, which are also referred to as tri-gate and FinFET configurations, there are three effective gates—two on either side and one on top—as is known in the field. As can also be seen in FIG. 2L, the channel region includes a first portion having sides in contact with the gate (the upper portion in this example case) and a second portion having sides in contact with the passivating layer 260. The second portion is sometimes referred to as the sub-fin portion and such a portion typically is in contact with STI material. However, as a result of the passivation techniques described herein, passivation layer 260 is included on both sides of this sub-fin portion, providing the benefits variously described herein (e.g., reduction in density of interface traps, reduction in source-to-drain leakage, etc.).

As will be apparent in light of the present disclosure, suitable doping may be performed in the channel and/or S/D regions depending on the material(s) in those regions and the desired end use or target application. For example, channel regions comprising Si or at least one III-V material may be p-type doped (e.g., to form an n-MOS transistor) and channel regions comprising SiGe and/or Ge may be n-type doped (e.g., to form a p-MOS transistor). In another example, for a tunnel field-effect transistor (TFET), the source may be p-type or n-type doped, the drain may be doped with an opposite polarity from the source (e.g., n-type doped when the source is p-type doped), and the channel may be undoped or intrinsic. In some embodiments, n-type and p-type transistors may be combined to form complementary MOS (CMOS) devices or complementary TFET (CTFET) devices, for example. Doping, as variously described herein, may be performed using any suitable techniques and dopants, depending, for example, upon the material being doped, the desired n-type or p-type doping result, and/or the target application. Numerous different doping schemes will be apparent in light of the present disclosure. Note that the processes 102-120 of method 100 are shown in a particular order in FIG. 1 for ease of description. However, one or more of the processes 102-120 may be performed in a different order or may not be performed at all. For example, box 118 is an optional process that may not be performed if the resulting desired transistor architecture is planar. Numerous variations on method 100 and the passivation techniques will be apparent in light of the present disclosure.

Figure 3B:
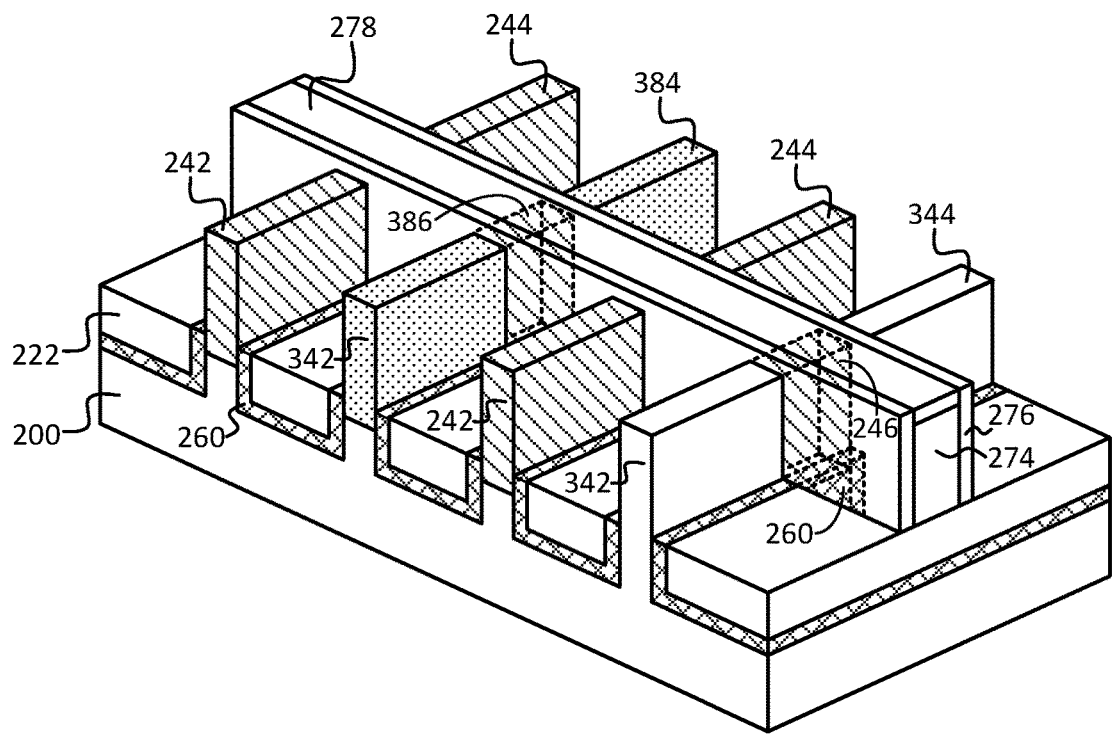
Figure 3C:
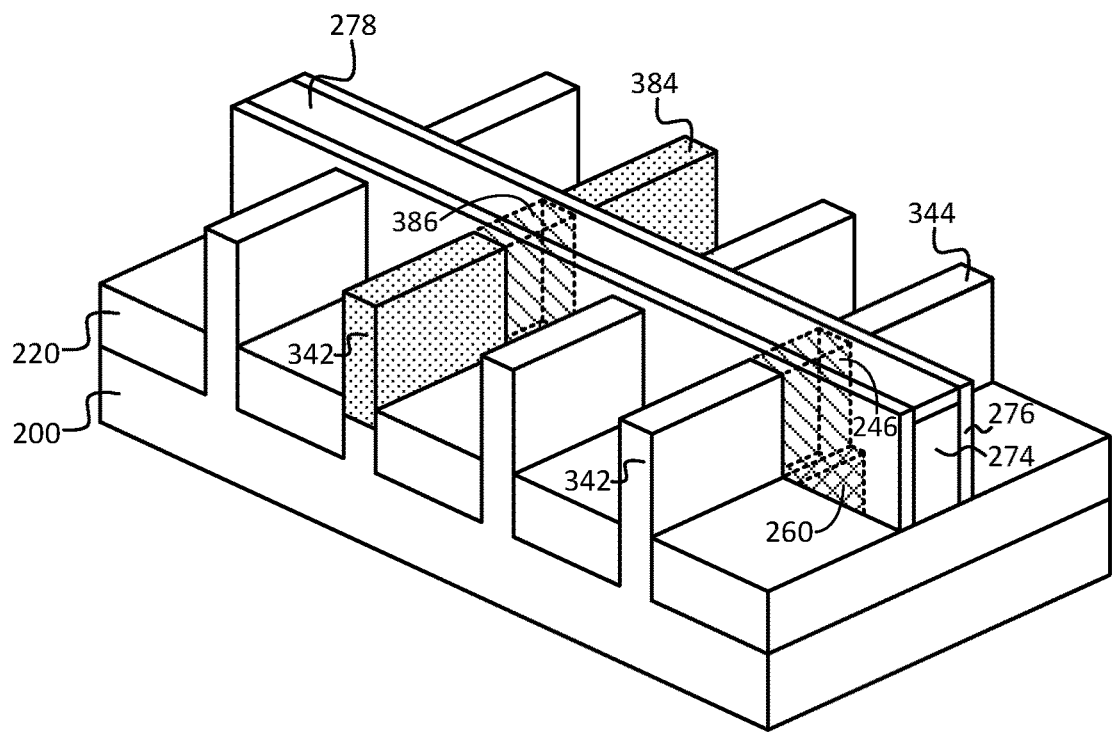

FIGS. 3A-C illustrate variations on the structure of FIG. 2L formed using the method 100 of FIG. 1, in accordance with some embodiments. More specifically, FIG. 3A is provided to illustrate an integrated circuit structure including transistors having nanowire configurations. As can be seen the channel region of the foremost (or right-most) fin in the structure of FIG. 2L was formed into two nanowires 346. A nanowire transistor (sometimes referred to as a gate-all-around or nanoribbon transistor) is configured similarly to a fin-based transistor, but instead of a finned channel region where the gate is on three sides (and thus, there are three effective gates), one or more nanowires are used and the gate material generally surrounds each nanowire on all sides. Depending on the particular design, some nanowire transistors have, for example, four effective gates. As can be seen in the example structure of FIG. 3A, the channel regions each have two nanowires 346, although other embodiments can have any number of nanowires. The nanowires 346 may have been formed while the channel regions were exposed during a replacement gate process (e.g., an RMG process), after the dummy gate is removed, for example. While the fully functional nanowires are gated in such configurations (and hence passivated, at least to some extent), the sub-fin/sub-channel regions may still require passivation to avoid unintentional current flow from source to drain through ungated sub-fin regions at the semiconductor/STI interface. Therefore, even such nanowire structures benefit from the sub-fin passivation techniques variously described herein. Note that any combination of transistor configurations may be used for a single integrated circuit, including planar, dual gate, finned (or tri-gate or FinFET), nanowire (or nanoribbon or gate-all-around), and/or any other suitable transistor configuration, depending on the end use or target application.

FIG. 3B is provided to illustrate additional variations in the integrated circuit structure of FIG. 2L, in accordance with some embodiments. As can be seen in FIG. 3B, only the channel portion of the right-most fin was replaced by replacement material 240, resulting in the same channel region 246 as shown in FIG. 2L, with S/D regions 342 and 344 comprising native substrate material (and extending from the substrate, as shown). The benefits of the passivating layer 260 variously described herein can still be achieved in such a configuration, as the passivating layer 260 is used to passivate the replacement material in a transistor channel region, which is still the case with channel region 246. Similarly, the second left-most fin illustrates that the S/D regions can be replaced/epitaxially grown (forming S/D regions 382 and 384), yet the benefits of the passivating layer 260 variously described herein can still be achieved, as the passivating layer 260 is still providing passivation to the corresponding replacement channel region 386. FIG. 3C is provided to illustrate an example integrated circuit structure where the passivation techniques are performed only in the channel region during a replacement gate process, in accordance with some embodiments. As can be seen in the right-most fin in such an example case, the passivating layer 260 is only located in the channel region 246, as it was deposited only in that region prior to the deposition of the replacement gate. Accordingly the S/D regions of the fin 342 and 344 comprise native substrate material (and extend from the substrate, as shown). Moreover, the first STI material 220 was only replaced in the channel region, leaving the first STI material surrounding the S/D regions. In this example structure, one or more of the S/D regions may be replaced/epitaxially grown, as the second left-most fin S/D regions 382 and 384 were. The passivation techniques variously described herein have applicability to many different configurations, such as for transistors formed using an ART process with a replacement channel region. Numerous variations and configurations will be apparent in light of the present disclosure.

FIGS. 4A-D illustrate example integrated circuit structures including a passivation layer at transistor channel/gate interfaces, in accordance with various embodiments of the present disclosure. FIGS. 4A-D are provided to primarily describe the passivation techniques at the transistor channel/gate interface, including multiple variations to the techniques and resulting structures. The previous relevant discussion with reference to substrate 200, STI regions 220, replacement material 240, spacers 276, and hardmask 278 applies equally to substrate 400, STI regions 420, replacement material 440, spacers 476, and hardmask 478 respectively. As can also be seen, FIGS. 4A-D each include three fins, each fin having S/D regions 442/444, where the previous relevant discussion with respect to S/D regions 242/244 applies equally to S/D regions 442/444. In the example structures of FIGS. 4A-C, the channel region 446 of the fins was maintained in a fin configuration, as can be seen. In the example structure of FIG. 4D, the channel region was formed into two nanowires (or nanoribbons) 448 to create transistor structures including a nanowire (or nanoribbon or gate-all-around) configuration. The previous relevant discussion with respect to nanowire configurations (e.g., with respect to nanowires 346 in FIG. 3A) applies equally to the structure of FIG. 4D.

Figure 4A:
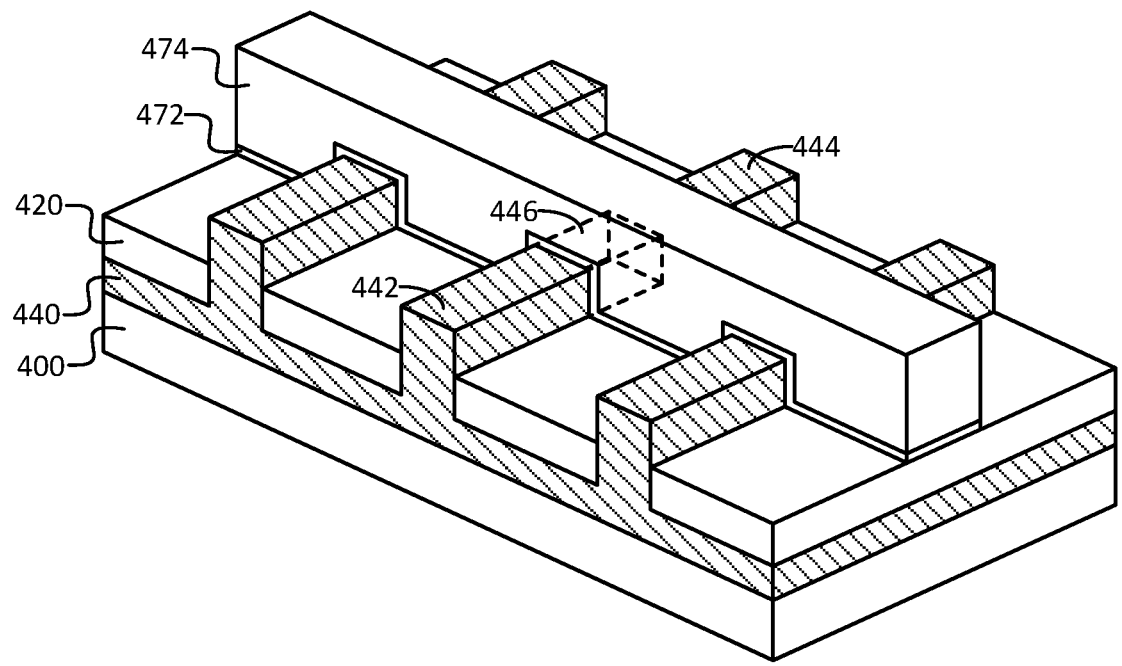
FIGS. 4A-D illustrate example integrated circuit structures including a passivation layer at transistor channel/gate interfaces, in accordance with various embodiments of the present disclosure.
Figure 4B:
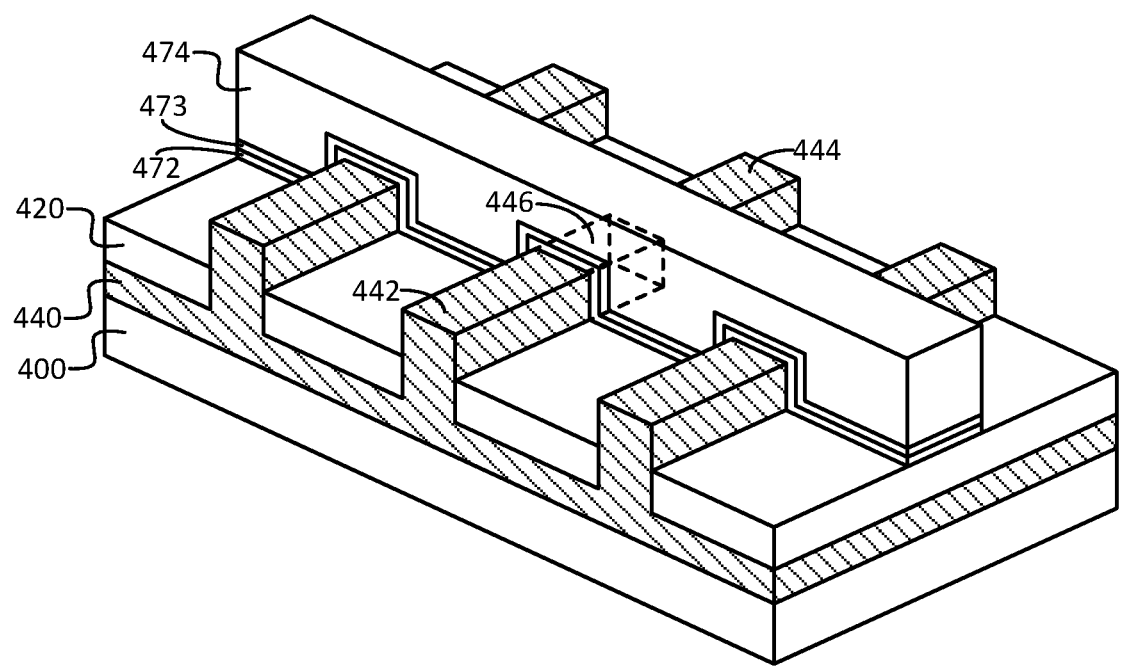

In the example structures of FIGS. 4A-B, layer 440 was deposited on substrate 400, where layer 440 includes a different material than that of substrate 400 (e.g., a 2-D layer) and fins were formed from the different material layer 440 (e.g., fin 442/446/444), as can be seen. The deposition of layer 440 may have been performed via a blanket deposition or any other suitable process, depending on the end use or target application. The fins in the example structures of FIGS. 4A-B may have been formed using any suitable techniques, such as depositing hardmask on layer 440 in the areas to be formed into fins, etching to form the fins, depositing STI material 420 and optionally planarizing, and recessing the STI 420 material to expose the upper portions of the fins 442/446/444 as shown. In the example structures of FIGS. 4A-B, it can be understood that the fins are formed and located above substrate 400. In the example structures of FIGS. 4C-D, replacement fins are formed on substrate 400, similar to the structures of FIGS. 2A-L and 3A-C. For example, the techniques for forming the fins of FIGS. 4C-D may have included depositing hardmask on substrate 400 in the areas to be formed into fins, etching to form the fins, depositing STI material 420 and optionally planarizing, etching the portion of the substrate fins to be removed and replaced by material 440 (used to form fins 442/446/444), depositing the replacement material 440 and optionally planarizing, and recessing the STI material to expose the upper portions of the fins 442/446/444 as shown. In the example structures of FIGS. 4C-D, it can be understood that the fins are formed and located on (and also above) substrate 400.

In the example structures of FIGS. 4A-B, a passivation layer 472 is shown at the channel/gate interface in a gate first process flow (also called up-front hi-k). Such a gate first flow may be performed at 120 in method 100 of FIG. 1, for example. In some embodiments, the gate first flow process may include forming fins to be used for a transistor device, as variously described herein, depositing the passivation layer 472 and optionally depositing a separate gate dielectric layer (e.g., layer 473 in FIG. 4B), depositing the metal gate material 474, and performing gate patterning followed by the standard process flow (e.g., spacer formation, source/drain processing, contact formation, etc.). In the example structure of FIG. 4A, the passivating layer 472 is also used as the gate dielectric, and thus a separate gate dielectric layer is not present. In the example structure of FIG. 4B, the passivating layer 472 is a transitional layer deposited prior to the gate dielectric layer 473. Therefore, in some embodiments, the passivation material may also be used as the gate dielectric (e.g., as is the case in FIG. 4A), such that the passivating layer 472 is the only layer between the channel 446 and the metal gate 474. Further, in some embodiments, the passivating 472 layer may be a separate and visually distinct layer (e.g., as is the case in FIG. 4B) where there is a cutoff between the materials of the passivation layer 472 and the gate dielectric layer 473. Further still, in some embodiments, the passivating material may be graded into the gate dielectric material, such that there is no clear separation between the materials but instead there is a transition in materials throughout a single layer (e.g., layer 472 in FIG. 4A). For example, in some such embodiments, the passivation material (e.g., aluminum oxide) may be present in high concentrations in such a graded layer at areas closest to the channel 446, while gate dielectric material (e.g., hafnium oxide) may be present in high concentrations in the graded layer at areas closest to the metal gate 474. In some embodiments, the passivation layer may have a thickness of 0.1 to 10 nm, for example, or any other suitable thickness depending on the end use or target application.

Figure 4C:
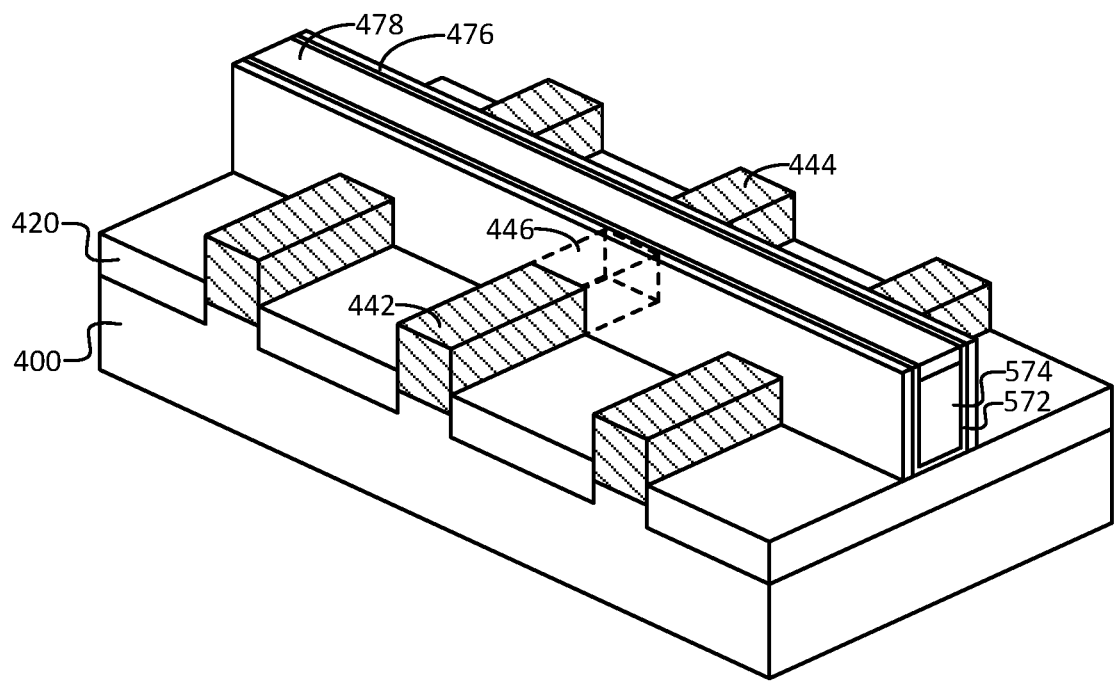
Figure 4D:
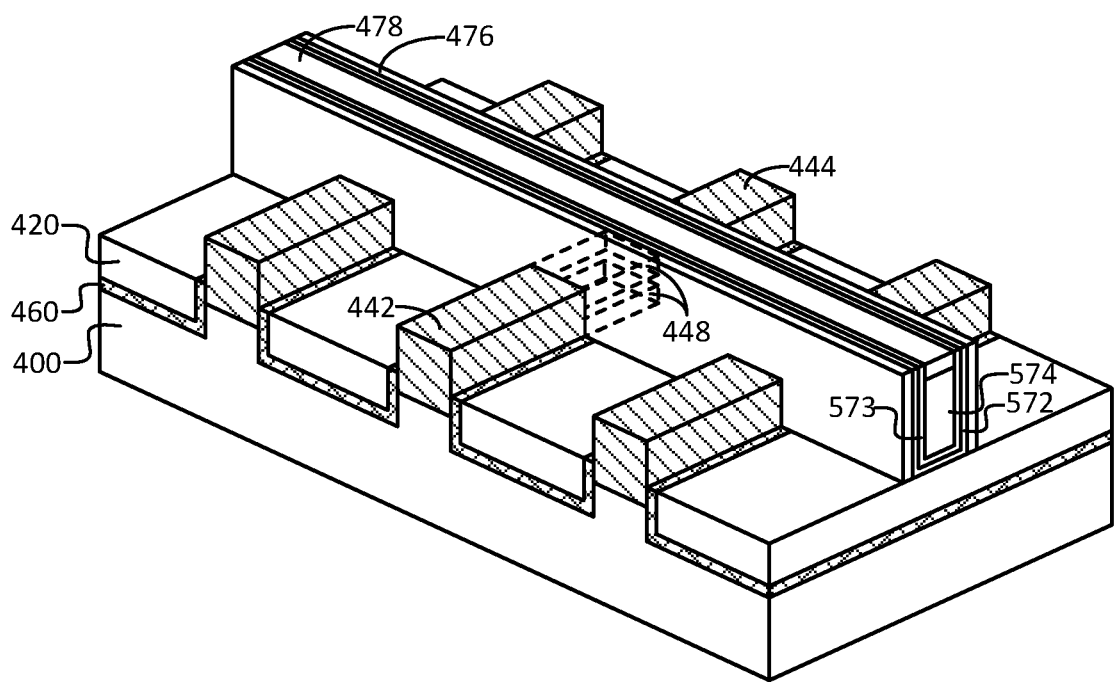

In the example structures of FIGS. 4C-D, a passivation layer 572 is shown at the channel/gate interface in a gate last process flow (also called replacement metal gate (RMG)). Such a gate last flow may be performed at 120 in method 100 of FIG. 1, for example. In some embodiments, the gate last flow process may include continuing from the structure of FIG. 4A where layer 472 is a dummy gate oxide layer (e.g., silicon dioxide) and layer 474 is polycrystalline silicon (and thus layers 472 and 474 are the dummy gate), performing formation of spacers 476, S/D 442/444 processing which may include replacement epitaxial S/D or wrap-around epitaxial S/D, depositing insulator and planarizing to the top of the dummy gate, removing the polycrystalline silicon 474 and the dummy oxide 472 from the dummy gate, depositing the passivation layer 572 and optionally depositing a separate gate dielectric layer 573, depositing the metal gate material 574, and performing any other standard flow processes (e.g., contact formation). In the example structure of FIG. 4C, the passivating layer 572 is also used as the gate dielectric, and thus a separate gate dielectric layer is not present. In the example structure of FIG. 4D, the passivating layer 572 is a transitional layer deposited prior to the gate dielectric layer 573. Therefore, in some embodiments, the passivation material may also be used as the gate dielectric (e.g., as is the case in FIG. 4C), such that the passivating layer 572 is the only layer between the channel 446 or 448 and the metal gate 574. Further, in some embodiments, the passivating 572 layer may be a separate and visually distinct layer (e.g., as is the case in FIG. 4D) where there is a cutoff between the materials of the passivation layer 572 and the gate dielectric layer 573. Further still, in some embodiments, the passivating material may be graded into the gate dielectric material, such that there is no clear separation between the materials but instead there is a transition in materials throughout a single layer (e.g., layer 572 in FIG. 4C). For example, in some such embodiments, the passivation material (e.g., aluminum oxide) may be present in high concentrations in such a graded layer at areas closest to the channel 446 or 448, while gate dielectric material (e.g., hafnium oxide) may be present in high concentrations in the graded layer at areas closest to the metal gate 574.

In some embodiments, the passivating layer 472, 572 at the channel/gate interface may be selected based on the channel material 446, 448, whether the passivating layer 472, 572 is a separate layer deposited prior to a gate dielectric layer, graded into the gate dielectric layer, or stands alone and is used as the gate dielectric layer. For example, in the case of a SiGe, Ge, or III-V channel, the passivating layer material may be aluminum oxide and/or titanium oxide (e.g., aluminum titanium oxide) which may be doped with up to, for example, 30% of yttrium, cerium, niobium, hafnium, zirconium, and/or other rare earth and transition metals. Further, in the case of a SiGe or Ge channel, the passivating layer material may be aluminum nitride, silicon, or yttrium and in the case of a III-V material channel, the passivating layer material may be sulfur. In some embodiments, the gate dielectric layer material, where included in addition to the passivation layer (e.g., in layer 473 and 573 of FIGS. 4B and 4D, respectively), may be hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate, for example. In some embodiments, the metal gate material 474, 574 may be aluminum (Al), tungsten (W), titanium (Ti), tantalum (Ta), copper (Cu), titanium nitride (TiN), or tantalum nitride (TaN), for example.

As can be seen in the example structure of FIG. 4D, a passivation layer 460 is also included at the sub-fin (or sub-channel)/isolation interface. Accordingly, the example structure of FIG. 4D is provided to illustrate that the passivation techniques can be used to passivate both channel/gate interfaces and sub-fin (or sub-channel)/isolation interfaces in the same structure or for the same transistor device. The previous relevant discussion with respect to passivation layer 260 applies equally to layer 460. Note that each individual fin shown in the structures variously described herein may be used for a separate transistor device or used in combination with one or more other fins to form a transistor device, depending on the end use or target application. Also note that the passivation techniques as variously described herein may be used with devices of varying scales, such as transistor devices in the micrometer range or transistor devices in the nanometer range (e.g., transistors formed at the 22, 14, 10, 7, or 5 nm process nodes). Numerous variations and configurations will be apparent in light of the preset disclosure.

Example System

Figure 5:
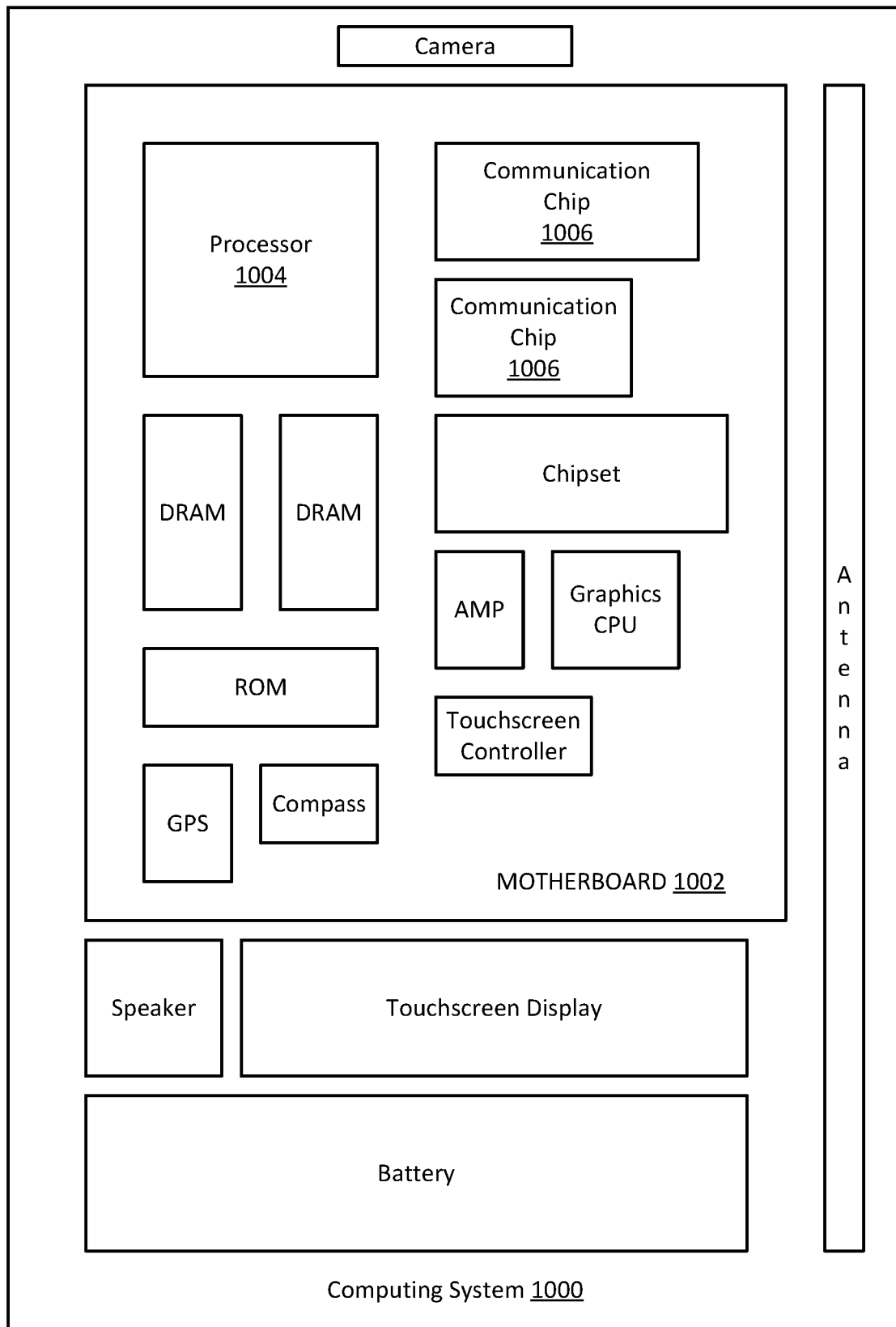
FIG. 5 illustrates a computing system implemented with integrated circuit structures or devices formed using the techniques disclosed herein, in accordance with an embodiment of the present disclosure.

FIG. 5 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices formed using the disclosed techniques, as variously described herein.

Further Example Embodiments

The following examples pertain to further embodiments, from which numerous permutations and configurations will be apparent.

Example 1 is a transistor including: a substrate; a channel including a different material than the substrate, the channel defined by a gate, wherein the channel is at least one of on and above the substrate; source and drain (S/D) regions adjacent to the channel; and a passivating layer between the channel and the gate. The passivating layer may be present to reduce interface trap density, for example.

Example 2 includes the subject matter of Example 1, wherein the passivating layer is the gate dielectric, such that the passivating layer is the only layer between the channel and a metal gate layer.

Example 3 includes the subject matter of Example 1, wherein the passivating layer is located between the channel and a gate dielectric layer.

Example 4 includes the subject matter of Example 1, wherein the passivating layer material is graded into a gate dielectric material, such that the passivating layer and the gate dielectric are a single layer.

Example 5 includes the subject matter of any of Examples 1-4, wherein the channel includes silicon germanium, germanium, or at least one III-V material and the passivating layer includes aluminum oxide.

Example 6 includes the subject matter of Example 5, wherein the aluminum oxide is doped with one of zirconium, yttrium, cerium, niobium, hafnium, and titanium in amounts up to 30%.

Example 7 includes the subject matter of any of Examples 1-4, wherein the channel includes silicon germanium, germanium, or at least one III-V material and the passivating layer includes titanium oxide.

Example 8 includes the subject matter of Example 7, wherein the titanium oxide is doped with one of zirconium, yttrium, cerium, niobium, hafnium, and aluminum in amounts up to 30%.

Example 9 includes the subject matter of any of Examples 1-8, wherein the gate is an up-front hi-k gate.

Example 10 includes the subject matter of any of Examples 1-8, wherein the gate is a replacement metal gate.

Example 11 includes the subject matter of any of Examples 1-10, further including an additional passivating layer located between a region below the channel and isolation material, wherein the sub-channel region includes the same materials as the channel, and wherein the additional passivating layer material is different than the isolation material.

Example 12 includes the subject matter of Example 11, wherein the sub-channel region includes germanium and the passivating material includes at least one of aluminum oxide, aluminum nitride, silicon, and yttrium.

Example 13 includes the subject matter of Example 11, wherein the sub-channel region includes at least one III-V material and the additional passivating layer material includes at least one of aluminum oxide, hafnium oxide, sulfur, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Example 14 includes the subject matter of any of Examples 1-13, wherein the transistor geometry includes at least one of a field-effect transistor (FET), metal-oxide-semiconductor FET (MOSFET), tunnel-FET (TFET), planar configuration, finned configuration, FinFET configuration, tri-gate configuration, nanowire configuration, and nanoribbon configuration.

Example 15 includes the subject matter of any of Examples 1-14, wherein the transistor is one of a p-type and n-type transistor.

Example 16 is a complementary metal-oxide-semiconductor (CMOS) device or complementary tunnel-field-effect transistor (CTFET) device including the subject matter of any of Examples 1-15.

Example 17 is a computing system including the subject matter of any of Examples 1-16.

Example 18 is a transistor including: a bulk silicon substrate; a channel including germanium or silicon germanium, the channel defined by a gate, wherein the channel is at least one of on and above the substrate; source and drain (S/D) regions adjacent to the channel; and an oxide passivating layer including at least one of aluminum and titanium between the channel and the gate.

Example 19 includes the subject matter of Example 18, wherein the passivating layer is the gate dielectric, such that the passivating layer is the only layer between the channel and a metal gate layer.

Example 20 includes the subject matter of Example 18, wherein the passivating layer is located between the channel and a gate dielectric layer.

Example 21 includes the subject matter of Example 18, wherein the passivating layer material is graded into a gate dielectric material, such that the passivating layer and the gate dielectric are a single layer.

Example 22 includes the subject matter of any of Examples 18-21, wherein the oxide passivating layer is doped with one of yttrium, cerium, niobium, hafnium, and zirconium in amounts up to 30%.

Example 23 includes the subject matter of any of Examples 18-22, wherein the gate is an up-front hi-k gate.

Example 24 includes the subject matter of any of Examples 18-22, wherein the gate is a replacement metal gate.

Example 25 includes the subject matter of any of Examples 18-24, further including an additional passivating layer located between a region below the channel and isolation material, wherein the sub-channel region includes the same materials as the channel, and wherein the additional passivating layer material is different than the isolation material.

Example 26 includes the subject matter of Example 25, wherein the sub-channel region includes germanium and the passivating material includes at least one of aluminum oxide, aluminum nitride, silicon, and yttrium.

Example 27 includes the subject matter of Example 25, wherein the sub-channel region includes at least one III-V material and the additional passivating layer material includes at least one of aluminum oxide, hafnium oxide, sulfur, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Example 28 includes the subject matter of any of Examples 18-27, wherein the transistor geometry includes at least one of a field-effect transistor (FET), metal-oxide-semiconductor FET (MOSFET), tunnel-FET (TFET), planar configuration, finned configuration, FinFET configuration, tri-gate configuration, nanowire configuration, and nanoribbon configuration.

Example 29 is a complementary metal-oxide-semiconductor (CMOS) device or complementary tunnel-field-effect transistor (CTFET) device including the subject matter of any of Examples 18-28.

Example 30 is a computing system including the subject matter of any of Examples 18-29.

Example 31 is a method of forming a transistor, the method including: providing a substrate; forming a fin above and/or on the substrate, the fin including a different material than the substrate; and forming a gate on the fin, wherein the gate defines a channel; wherein an oxide passivating layer including at least one of aluminum and titanium is located between the channel and the gate. The passivating layer may be present to reduce interface trap density, for example.

Example 32 includes the subject matter of Example 31, wherein the passivating layer is the gate dielectric, such that the passivating layer is the only layer between the channel and a metal gate layer.

Example 33 includes the subject matter of Example 31, wherein the passivating layer is located between the channel and a gate dielectric layer.

Example 34 includes the subject matter of Example 31, wherein the passivating layer material is graded into a gate dielectric material, such that the passivating layer and the gate dielectric are a single layer.

Example 35 includes the subject matter of any of Examples 31-34, wherein the channel includes silicon germanium or germanium.

Example 36 includes the subject matter of any of Examples 31-34, wherein the channel includes at least one III-V material.

Example 37 includes the subject matter of any of Examples 31-36, wherein the oxide passivating layer is doped with one of yttrium, cerium, niobium, hafnium, and zirconium in amounts up to 30%.

Example 38 includes the subject matter of any of Examples 31-37, wherein the gate is formed via a gate first process.

Example 39 includes the subject matter of any of Examples 31-37, wherein the gate is formed via a gate last process.

Example 40 includes the subject matter of any of Examples 31-39, further including an additional passivating layer located between a region below the channel and isolation material, wherein the sub-channel region includes the same materials as the channel, and wherein the additional passivating layer material is different than the isolation material.

Example 41 includes the subject matter of Example 40, wherein the sub-channel region includes germanium and the passivating material includes at least one of aluminum oxide, aluminum nitride, silicon, and yttrium.

Example 42 includes the subject matter of Example 40, wherein the sub-channel region includes at least one III-V material and the additional passivating layer material includes at least one of aluminum oxide, hafnium oxide, sulfur, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate.

Example 43 includes the subject matter of any of Examples 31-42, wherein the transistor geometry includes at least one of a field-effect transistor (FET), metal-oxide-semiconductor FET (MOSFET), tunnel-FET (TFET), planar configuration, finned configuration, FinFET configuration, tri-gate configuration, nanowire configuration, and nanoribbon configuration.

Example 44 includes the subject matter of any of Examples 31-43, wherein the transistor is one of a p-type and n-type transistor.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit including at least one transistor, the integrated circuit comprising:
    a substrate;
    a body above the substrate and including a compositionally different material relative to the substrate;
    a gate electrode at least above the body;
    a structure at least between the gate electrode and the body, wherein the structure has graded concentrations of hafnium and aluminum, such that (i) hafnium in the structure is graded from a first concentration near the gate electrode to a second concentration near the body, and (ii) aluminum in the structure is graded from a third concentration near the gate electrode to a fourth concentration near the body, wherein the fourth concentration is higher than the third concentration; and
    a first region and a second region, the body between the first and second regions, the first and second regions including semiconductor material.

2. The integrated circuit of claim 1, wherein the first concentration is higher than the second concentration.

3. The integrated circuit of claim 1, wherein the body is a body of silicon, germanium, or silicon and germanium.

4. The integrated circuit of claim 1, wherein the structure includes one or more of zirconium, yttrium, cerium, niobium, or titanium.

5. The integrated circuit of claim 1, wherein the body is a fin, the fin being between two sections of the gate electrode.

6. The integrated circuit of claim 1, wherein the body is a nanowire, the gate electrode surrounding the nanowire.

7. The integrated circuit of claim 1, further comprising:
    a first isolation region and a second isolation region;
    a sub-body region below the body and between the first and second isolation regions; and
    a layer between the sub-body region and the first isolation region, the layer also between the sub-body region and the second isolation region;
    wherein the first and second isolation regions include a first insulator material, and wherein the layer includes a second insulator material compositionally different from the first insulator material.

8. The integrated circuit of claim 7, wherein the sub-body region includes germanium and the layer includes at least one of aluminum, silicon, nitrogen, oxygen, or yttrium.

9. The integrated circuit of claim 7, wherein the sub-body region includes group III-V semiconductor material and the layer includes at least one of aluminum oxide, hafnium oxide, sulfur, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, or lead zinc niobate.

10. The integrated circuit of claim 1, wherein the first and second regions include an n-type impurity dopant or a p-type impurity dopant.

11. A complementary metal-oxide-semiconductor (CMOS) circuit or complementary tunnel-field-effect transistor (CTFET) circuit comprising the integrated circuit of claim 1.

12. A computing system comprising the integrated circuit of claim 1.

13. The integrated circuit of claim 1, wherein the body is a fin, and the structure is (1) between the gate electrode and a top of the fin, and (2) between the gate electrode and sides of the fin.

14. An integrated circuit including at least one transistor, the integrated circuit comprising:
- a substrate including silicon;
- a body above the substrate and including one or both of germanium or silicon;
- a gate electrode at least above the body;
- a structure between the gate electrode and the body,
- wherein the structure has graded concentration of hafnium such that hafnium in the structure is graded from a first concentration directly adjacent to the gate electrode to a second concentration directly adjacent to the body, the first concentration higher than the second concentration,
- wherein the structure has graded concentration of aluminum such that aluminum in the structure is graded from a third concentration directly adjacent to the gate electrode to a fourth concentration directly adjacent to the body, the fourth concentration higher than the third concentration;
- a first region and a second region, the body between the first and second regions, the first and second regions including semiconductor material.

15. The integrated circuit of claim 14, wherein the structure comprises a first portion and a second portion, the first portion directly on the body, the second portion between the first portion and the gate electrode, wherein the first portion comprises alumina, and at least one element of the second portion is hafnium.

16. The integrated circuit of claim 14, wherein the structure comprises a first portion and a second portion, the first portion directly on the body, the second portion between the first portion and the gate electrode, wherein the first portion comprises alumina, and the body is a germanium body.

17. An integrated circuit including at least one transistor, the integrated circuit comprising:
- a body comprising semiconductor material;
- a gate structure at least above the body and to sides of the body, such that at least a portion of the body is between portions of the gate structure;
- a first layer comprising aluminum and a second layer comprising hafnium, wherein the first layer and the second layer are between the gate structure and the body, wherein the first layer is between the second layer and the body, and wherein the first layer is graded into the second layer, such that a concentration of aluminum in the first layer is higher than a concentration of aluminum in the second layer, and a concentration of hafnium in the second layer is higher than a concentration of hafnium in the first layer; and
- a first region and a second region, the body between the first and second regions, the first and second regions including semiconductor material.

18. The integrated circuit of claim 17, wherein the body is a nanowire, the gate structure surrounding the nanowire.

19. The integrated circuit of claim 17, wherein one or both the first and second layers include one or more of zirconium, yttrium, cerium, niobium, or titanium, and wherein the body comprises one or both of silicon and germanium.

* * * * *